(12) United States Patent
Baudoin et al.

(10) Patent No.: US 12,179,192 B2
(45) Date of Patent: Dec. 31, 2024

(54) ACOUSTIC TWEEZERS

(71) Applicants: CENTRE NATIONAL DE LA RECHERCHE SCIENTIFIQUE, Paris (FR); UNIVERSITÉ DE LILLE, Lille (FR); ECOLE CENTRALE DE LILLE, Villeneuve d'Asq (FR); SORBONNE UNIVERSITE, PARIS (FR)

(72) Inventors: Michaël Aymeric Baudoin, Lezennes (FR); Olivier Khalil Nizar Bou Matar-Lacaze, Saint Amand les Eaux (FR); Antoine Jean-Pierre Riaud, La Roche sur Yon (FR); Jean-Louis Pierre Thomas, Montgeron (FR)

(73) Assignees: CENTRE NATIONAL DE LA RECHERCHE SCIENTIFIQUE, Paris (FR); UNIVERSITÉ DE LILLE, Lille (FR); ECOLE CENTRALE DE LILLE, Villeneuve d'Asq (FR); SORBONNE UNIVERSITE, Paris (FR)

( * ) Notice: Subject to any disclaimer, the term of this patent is extended or adjusted under 35 U.S.C. 154(b) by 0 days.

(21) Appl. No.: 18/211,184

(22) Filed: Jun. 16, 2023

(65) Prior Publication Data
US 2023/0330667 A1    Oct. 19, 2023

Related U.S. Application Data

(62) Division of application No. 16/085,424, filed as application No. PCT/EP2016/055611 on Mar. 15, 2016, now Pat. No. 11,731,127.

(51) Int. Cl.
*B01L 3/00*    (2006.01)
*G01N 15/1404*    (2024.01)
(Continued)

(52) U.S. Cl.
CPC ..... *B01L 3/502715* (2013.01); *B01L 3/50273* (2013.01); *B01L 3/502761* (2013.01);
(Continued)

(58) Field of Classification Search
CPC .......... B01L 3/502715; B01L 3/50273; B01L 3/502761; B01L 2200/0668;
(Continued)

(56) References Cited

U.S. PATENT DOCUMENTS 3,609,416 A    9/1971   Epstein
4,011,747 A    3/1977   Shaw
(Continued)

FOREIGN PATENT DOCUMENTS

CN    1921301 A    2/2007
WO    2013/116311 A1    8/2013
(Continued)

OTHER PUBLICATIONS

CN 1346056 with English Translation; Inv: Wang et al.; Pub. Date: 2002 (Year: 2002).*
(Continued)

*Primary Examiner* — Joseph C Rodriguez
(74) *Attorney, Agent, or Firm* — Hauptman Ham, LLP

(57) ABSTRACT

Electroacoustic device having a transducer including a piezoelectric substrate, first and second electrodes of inverse polarity having respective first and second tracks provided on said substrate, the first and second tracks spiraling around a same center (C), the transducer being configured for generating a swirling ultrasonic surface wave in the substrate.

15 Claims, 12 Drawing Sheets

(51) Int. Cl.
*G02B 21/32* (2006.01)
*H03H 9/145* (2006.01)

(52) U.S. Cl.
CPC ......... *G01N 15/1404* (2013.01); *G02B 21/32* (2013.01); *H03H 9/14505* (2013.01); *B01L 2200/0668* (2013.01); *B01L 2400/0436* (2013.01); *G01N 2015/142* (2013.01)

(58) Field of Classification Search
CPC ............ B01L 2400/0436; G02B 21/32; G01N 2015/142; H03H 9/14505; B06B 1/0651; B06B 1/0662
See application file for complete search history.

(56) References Cited

U.S. PATENT DOCUMENTS

| | | | |
|---|---|---|---|
| 4,453,242 A | 6/1984 | Toda | |
| 4,697,195 A | 9/1987 | Quate et al. | |
| 5,400,788 A | 3/1995 | Dias et al. | |
| 6,029,518 A * | 2/2000 | Oeftering | B01D 19/0078 73/570.5 |
| 6,919,669 B2 | 7/2005 | Bryant et al. | |
| 7,878,063 B1 | 2/2011 | Cular et al. | |
| 8,330,557 B2 * | 12/2012 | Yamada | H03H 9/14547 333/195 |
| 11,534,761 B2 * | 12/2022 | Baudoin | B01L 99/00 |
| 11,731,127 B2 * | 8/2023 | Baudoin | H03H 9/14505 310/313 B |
| 2005/0266478 A1 * | 12/2005 | Huang | B01L 3/502792 438/1 |
| 2009/0114798 A1 | 5/2009 | Tigli et al. | |
| 2010/0139377 A1 | 6/2010 | Huang et al. | |
| 2010/0219910 A1 | 9/2010 | Yamada et al. | |
| 2010/0298152 A1 | 11/2010 | Brown et al. | |
| 2012/0149126 A1 | 6/2012 | Wilson et al. | |
| 2013/0047728 A1 | 2/2013 | Cochran et al. | |
| 2013/0192958 A1 | 8/2013 | Ding et al. | |
| 2014/0033808 A1 * | 2/2014 | Ding | C12M 47/04 73/61.75 |
| 2019/0160463 A1 * | 5/2019 | Ai | B01L 3/00 |
| 2021/0129149 A1 * | 5/2021 | Ai | B01L 3/502707 |
| 2022/0250072 A1 * | 8/2022 | Friend | B06B 1/0651 |

FOREIGN PATENT DOCUMENTS

| | | | |
|---|---|---|---|
| WO | 2014/178782 A1 | 11/2014 | |
| WO | WO-2015058265 A1 * | 4/2015 | ........ B01L 3/502715 |
| WO | 2015/134831 A1 | 9/2015 | |

OTHER PUBLICATIONS

International Search Report issued on Nov. 29, 2016, for corresponding International Patent Application No. PCT/EP2016/055611 (3 pages).
Written Opinion issued on Nov. 29, 2016, for corresponding International Patent Application No. PCT/EP2016/055611 (5 pages).
[Supportive Materials for Exception to Loss of Novelty] Antoine Riaud et al., "Synthesis of anisotropic swirling surface acoustic waves by inverse filter, towards integrated generators of acoustical vortices", Arxiv.org, e-print archive, physics, Apr. 30, 2015, 06878, https://arxiv.org/pdf/1504.06878.pdf.
[Supportive Materials for Exception to Loss of Novelty] Antoine Riaud et al., "Anisotropic swirling surface acoustic waves from inverse filtering for on-chip generation of acoustic vortices", Physical Review Applied, Sep. 15, 2015, vol. 4, No. 3, 034004, p. 1-10.
S.B.Q. Tran et al. "Fast acoustic tweezer for the two-dimensional manipulation of individual particles in microfluidic channels," Applied Physics Letters, American Institute of Physics, 2012, vol. 101, No. 11, (5 pages).
International Search Report issued on Jul. 28, 2017, for International Patent Application No. PCT/EP2017/062219 (4 pages).
Written Opinion issued on Jul. 28, 2017, for International Patent Application No. PCT/EP2017/062219 (5 pages).
Jinjie Shi et al., "Three-dimensional continuous particle focusing in a microfluidic channel via standing surface acoustive waves (SSAW)," Lab on a Chip, vol. 11, No. 14, May 27, 2011, (7 pages).
Vincent Laude et al., "Annular interdigital transducer focuses piezoelectric surface waves to a single point," Cornell University Library, Dec. 23, 2007, pp. 1-3.
Vincent Laude et al., "Subwavelength focusing of surface acoustic waves generated by an annular interdigital transducer," Applied Physics Letters, vol. 92, 2008, 094104 (3 pages).
Office Action issued for corresponding Japanese Patent Application No. 2018-561251 on Jun. 14, 2021, along with an English machine translation (12 pages).
Choe Y. et al., "Ultrasonic Microparticle Trapping by Multi-Foci Fresnel Lens", 2011 Joint Conference of the IEEE International Frequency Control Symposium and the European Frequency and Time Forum (FCS) Proceedings, United States, IEEE, 2011, pp. 1-4.

* cited by examiner

ACOUSTIC TWEEZERS

CROSS-REFERENCE TO RELATED APPLICATION

This application is a Divisional of U.S. patent application Ser. No. 16/085,424 filed on Sep. 14, 2018, which is a national stage filing under 35 U.S.C § 371 of PCT application number PCT/EP2016/055611 filed on Mar. 15, 2016. The disclosures of the above-listed applications are hereby incorporated by reference herein in their entireties.

The present invention relates to electroacoustic devices notably for manipulating objects which size is less than $10^{-2}$ m, immersed in a liquid medium and in particular being denser and/or more rigid than the liquid medium.

BACKGROUND

The selective manipulation of nano-sized and micro-sized objects is a complex operation in various technical domains, such as cellular biology, microfluidic, nano- and micro-sized system assembly. Manipulation might be performed using a tool, for instance tweezers or a micropipette. The object is then manipulated through displacement of the tool. Such a manipulating method, which is generally named "direct contact" method, is not desirable, in particular when the object is soft, or tacky, or even brittle. Furthermore, it may alter the manipulated object. Last, the introduction of the tool in a system wherein the object is located may modify the properties of the system. For instance in case the object is submitted to an electromagnetic field, introducing the tool might create a disturbance of said field. It can also introduce some pollution. In case the system is a biological medium comprising cells, the cell behavior can be modified by the introduction of the tool.

Alternative contactless methods have been developed, such as dielectrophoresis, magnetophoresis, or optophoresis, also named "optical tweezers" method. However, all these techniques have major drawbacks. For instance, dielectrophoresis depends on the object polarizability and requires installing electrodes in the vicinity of the object to be manipulated. Magnetophoresis requires grafting of markers onto the object. Optophoresis may be used with or without grafting but is limited to very small forces by the significant heating and photo-toxicity inherent of this method.

Another method has been developed, named "standing wave acoustophoresis", which consists in implementing surface acoustic waves (SAW) generated in a substrate for manipulating an object lying or overlapping the substrate.

U.S. Pat. No. 7,878,063 B1 describes an electroacoustic device comprising a substrate and three pairs of interdigitated transducers on the substrate. Each pair of transducer defines an acoustic path for propagating a surface acoustic wave generated by the transducers. The three acoustic paths intersect, thus creating a center region for detecting biological species;

WO 2013/116311 A1 discloses an apparatus for manipulating particles comprising a pair of variable frequency interdigitated transducers and a channel defined on a substrate, disposed asymmetrically between the transducers.

WO 2015/134831 describes an acoustic apparatus including a first interdigitated transducer arrangement to generate a first acoustic wave and a second interdigitated transducer arrangement to generate a second acoustic wave in a non-parallel direction relative to the first acoustic wave, and a manipulation region at least partially defined by an interference pattern at least partially formed by interaction between the first acoustic wave and the second acoustic wave.

The article "*Fast acoustic tweezer for the two-dimensional manipulation of individual particles in microfluidic channels*", S. B. Q. Tran, P. Marmottant and P. Thibault, *Applied Physics Letters*, American Institute of Physics, 2012, 101, pp. 114103, describes a device comprising four interdigitated transducers provided on a substrate at a regular spacing around a central zone. Each transducer generates a standing surface acoustic waves. Implementation of the device provides displacement of a particle in the central zone.

US 2013/0047728 A1 teaches an apparatus comprising an ultrasound source for providing a variable ultrasound signal within a region of interest, and a controller connected to the ultrasound source such that it provides a control signal to the ultrasound source. The variable ultrasound signal creates a pressure field within the region of interest, the shape and/or position of which can be altered by changing the control signal input to the ultrasound source such that a particle within the region of interest will move in response to changes in the pressure field. However, the apparatus of US 2013/0047728 A1 is configured for generating bulk acoustic wave. As a consequence, it requires components of large size which prevent from any use on lab-on-chips. In addition, it is not adapted to generate any surface acoustic wave.

All the known standing wave acoustophoresis methods consist in generating standing acoustic waves for manipulating objects. However, the selectivity of these methods is limited. In particular, all objects do move toward either the nodes or anti-nodes of the waves. As a consequence, the standing wave acoustophoresis methods do not allow the selective manipulation of an object independently from its neighbors.

SOME EXAMPLE EMBODIMENTS

Therefore, there is a need for an electroacoustic device and for a method for manipulating at least one object that overcome at least some of the drawbacks of the techniques of the prior art.

Exemplary embodiments of the invention relate to an electroacoustic device comprising a transducer comprising a piezoelectric substrate, first and second electrodes of inverse polarity comprising respective first and second tracks provided on said substrate, the first and second tracks spiraling around a same center, the transducer being configured for generating a swirling ultrasonic surface wave in the substrate.

A swirling surface acoustic wave (SAW) is a wave that propagates spinning around a phase singularity where destructive interferences lead to cancellation of the wave amplitude. A swirling SAW can propagate in an isotropic substrate and/or in an anisotropic substrate.

FIG. 1 illustrates the amplitude 5 of a swirling SAW at the surface of an isotropic substrate along directions X and Y of the substrate. A swirling SAW comprises an area 10 of low amplitude, generally named "dark spot" encircled by concentric rings 15 of high amplitude, generally named "bright rings", illustrated in dashed line in FIG. 1. The dark spot is an area of low radiation pressure whereas the bright circles are zones of high radiation pressure. Therefore, a swirling SAW propagating at the surface of a substrate is such that an object lying for instance on the substrate and located on a bright circle is attracted by the dark spot of the swirling SAW as indicated by the arrows 20 on FIG. 1, as soon as its size is substantially equal or smaller than the fundamental wavelength of the swirling SAW. The object is entrapped by the dark spot.

The invention provides several advantages as compared to prior art devices performing standing wave acoustophoresis. First, an electroacoustic device according to the invention is simpler to implement, since it can provide manipulation of an object with only a single transducer. It may also be powered with a single low cost powering system. In addition, it does not require any specific setting of the transducer as compared to the prior art, where every transducer of the set of transducers has to be set precisely so that the interferences of the SAWs generated by the transducers result in a radiation pressure field capable of object manipulation. Moreover, the invention is not limited by any substrate property with regard to SAW propagation. In particular, the substrate can be preferably anisotropic. Further, the electroacoustic device can be tuned to a wider range of object sizes than devices of the prior art. In particular, the device can apply larger forces than optophoresis devices on a same sized object without destroying it.

In the present specification, a SAW is considered to have a frequency ranging between 1 MHz and 10000 MHz.

The electroacoustic device according to the first aspect of the invention may further present one or more of the following optional features:

a set consisting in the first and second electrodes surrounds entirely the center, and define a central zone;

the first track and/or the second track extend(s) over more than 90°, preferably over more than 180°, even preferably over more than 270° around the center;

each of the first and second tracks spirals along a line defined by the equation $$R(\theta) = \frac{\varphi_0 - \omega\mu_0(\theta) + \alpha(\bar{\psi}(\theta)) - \frac{\pi}{4}\text{sgn}(h''(\bar{\psi}(\theta), \theta)) - l\theta}{\omega s_r(\bar{\psi}(\theta))\cos(\bar{\psi}(\theta) - \theta)}$$

wherein:

$R(\theta)$ is the polar coordinate of the line with respect with the azimuthal angle $\theta$, $\varphi_0$ is a free parameter, l is the vortex order of a swirling SAW of pulsation $\omega$, l being an integer such that $|l|\geq 1$.

$\mu_0(\theta)$ is given by:

$$\mu_0(\theta) = \sum_{i=1}^{n} s_z^{(i)}(\theta)(z_i - z_{i-1})$$

where $z_i - z_{i-1}$ is the distance between two successive interfaces separating materials stacked onto the substrate, $z_0$ being the height of the interface between the substrate and the layer contacting the substrate, $\mu_0(\theta)=0$ in case of the absence of stacked layers $h''(\bar{\psi})$ is $\frac{\partial^2}{\partial \psi^2}[s_r(\psi)\cos(\psi - \theta)]$ evaluated at $\psi = \bar{\psi}$ where $\bar{\psi}$ depends on $\Theta$ as follows:

$$\bar{\psi}(\Theta) = \Theta + a\tan 2\left(\frac{s_r'(\Theta)}{\sqrt{s_r'^2(\Theta) + s_r^2(\Theta)}}, \frac{s_r(\Theta)}{\sqrt{s_r'^2(\Theta) + s_r^2(\Theta)}}\right)$$

$s_r(\psi)$ is the wave slowness on the surface plane of the substrate in the direction of propagation $\psi$, and $s_z(\psi)$ is the wave slowness in the out of plane direction, a wave slowness in a direction i being r or z being computed from the wavenumber $k_i$ as $s_r(\psi)=k_r(\psi)/\omega$: and $s_z(\psi)=k_z(\psi)/\omega$ $s_r'(\psi)$ is the derivative of $s_r(\psi)$ in respect to the direction of propagation, $\alpha(\psi)$ is the phase of the vertical motion of the wave propagating in direction $\psi$ versus the associated electric field;

the radial step between adjacent first and second tracks is comprised between $0.48\lambda$ and $0.52\lambda$, preferably equal to $\lambda/2$, $\lambda$ being the fundamental wavelength of the swirling ultrasonic surface wave;

each of the first and second tracks runs along at least one revolution;

the first and the second electrode comprise respective first and second power terminals to which the first and second track are electrically connected;

the first and second electrodes comprise a plurality of respective first and second tracks;

the transducer is interdigitated;

the electroacoustic device comprises first and second transducers configured for generating first and second swirling ultrasonic surface waves of different fundamental wavelengths in the substrate, the first and second tracks of each of the first and second transducers spiraling around a same center;

the transducer intended to generate the lowest fundamental wavelength among the first and second transducers surrounds the other transducer;

two consecutive first, respectively second tracks are separated, along at least one radius, by at least two consecutive second, respectively first tracks;

According to a second aspect, exemplary embodiment of the invention relates to an electroacoustic device comprising:

a piezoelectric substrate, interdigitated portions of a set of at least four interdigitated transducers arranged on said substrate around a central zone, the transducers being configured for generating a surface acoustic wave in said substrate, a controller electrically connected to and providing electrical power to each transducer and being configured such that the surface acoustic waves emitted by the set of transducers interfere the ones with the others to generate a swirling ultrasonic wave at least in the central zone.

The electroacoustic device according to the second aspect of the invention is particularly well adapted for generating swirling SAW in an anisotropic substrate.

Notably, the electroacoustic device according to this second aspect of the invention achieves generating a swirling SAW having a well-defined dark spot. It is thus more selective than the acoustophoresis devices of the prior art.

Furthermore, the electroacoustic device according to this second aspect is versatile, since the controller can be configured for generating other kinds of SAWs, such as generalized Bessel waves of order l=0, or even standing waves.

The electroacoustic device according to this second aspect of the invention may further present one or more of the following optional features:
- the electroacoustic device comprises at least eight, preferably at least sixteen, or even at least thirty two interdigitated transducers;
- the interdigitated portions are substantially regularly arranged around a central zone;
- the interdigitated portions are arranged around a circle or preferably around a line homothetic to the wave surface;
- more than 50%, preferably more than 70% of the perimeter of the central zone is defined by tracks of the transducers;
- the interdigitated tracks of at least one, preferably all the transducers, are curved;
- the curved tracks are convex toward the central zone;
- the curved tracks are concave toward the central zone.

According to anyone of the first and second aspects, the electroacoustic device may further comprise one or more of the following optional features:
- the transducer is covered by a protective coating, preferably comprising silica;
- the electroacoustic device further comprises a support overlapping the transducer and the substrate, the support and the substrate being acoustically coupled such that a swirling ultrasonic surface wave generated in the substrate is transmitted to the support and propagates as an acoustical vortex or a degenerated acoustical vortex in the bulk of the support;
- the support is made at least partially of a non-opaque and preferably transparent material;
- the support is made of a non-piezoelectric material;
- the support is made of an isotropic material with respect to the propagation of an ultrasonic wave;
- the support comprises a material chosen among a glass and a polymer, in particular a thermoplastic, most preferably polymethylmethacrylate (PMMA).
- the support comprises glass;
- the electroacoustic device comprises a layer made of a coupling fluid sandwiched in between the substrate and the support;
- the transducer is sandwiched in between the substrate and the support;
- at least a part of the substrate is sandwiched in between the transducer and the support;
- the transducer is configured for generating a swirling surface acoustic wave such that the radius of the dark spot influence zone of the swirling surface acoustic wave ranges between $0.1\lambda$ and $0.7\lambda$, preferably between $0.2\lambda$ and $0.55\lambda$, $\lambda$ being the wavelength of the swirling surface acoustic wave; the "radius of the dark spot influence zone" is defined by the distance between the location of lowest amplitude in the dark spot and the by the location of maximum of amplitude of the first bright ring;
- the substrate is a plate having a thickness greater or equal than 500 μm;
- the electroacoustic device comprises a base, preferably made of a non-piezoelectric material, on which the substrate is disposed;
- the base is made at least partially of a non-opaque, preferably a transparent material, notably made of glass;
- the substrate is in the form of a layer deposited onto the base, the layer thickness being less than $\lambda/10$, $\lambda$ being the fundamental wavelength of the swirling ultrasonic surface wave;
- the base is part of an objective of a microscope or is part of a device configured to be fixed to an objective of a microscope;
- the substrate is made of an anisotropic material, preferably chosen among lithium niobiate, lithium titanate, quartz, zinc oxide, aluminum nitride, lead titano-zircanate, and their mixtures;
- the substrate is at least partially made of a non-opaque, preferably a transparent material;
- the transducer is configured to generate a swirling surface acoustic wave whose fundamental wavelength $\lambda$ ranges between $10^{-7}$ m and $10^{-3}$ m;
- the swirling surface acoustic wave is a generalized Lamb wave or preferably a generalized Rayleigh wave;
- the electroacoustic device comprises a plurality of transducers configured for generating swirling ultrasonic surface waves of different fundamental wavelengths in the substrate;
- the electroacoustic device comprises a visual marking located in the central zone of the transducer, preferably made of the same material as the first and second tracks;
- the electroacoustic device is disk shaped;
- the substrate is mounted rotatable on a pivot around a rotation axis
- the electroacoustic device further comprises first and second transducers, the location of the center of the first transducer in a first arrangement of the device corresponding to the location of the center of the second transducer in a second arrangement of the device, the device being preferably configured such that the transition from the first to the second arrangement be operated by rotation around a pivot
- the electroacoustic device comprises contact brushes for powering the transducer electrodes;
- the electroacoustic device comprises first and second transducers, the contact brushes being in contact and powering the respective first and second transducers, in respective first and second arrangements of the device, the device being preferably configured such that the transition from the first to the second arrangement be operated by rotation around a pivot.

The electroacoustic device comprises an organ configured for displacing the support relatively to the transducer, preferably by translation along anyone of two axis both perpendicular, and parallel to the substrate.

Preferably, the first and second electrodes are deposited onto the substrate by photolithography. In particular, a layer of a material comprising chromium or titanium might be deposited onto the substrate before depositing the electrodes in order to improve the adherence of the electrodes on the substrate.

Preferably, the first and second electrodes are made from a metallic material, preferably chosen among gold, silver, aluminum and their mixtures. Aluminum is preferred for applications at frequency higher than 100 MHz. Gold and/or silver are preferred when a good conductivity is required.

The width, measured along a radial direction of the tracks of the first and second electrodes, can be equal. In a variant, the width can be different.

The substrate can be plane or curved.

The present invention also relates to a method for configuring an electroacoustic device according to the second aspect of the invention, the method comprising:

a. successively powering a single transducer i of the set of transducers of the electroacoustic device with an electrical input signal $e_i(t)$, and if appropriate switching off the other powered transducer(s), and measuring at each of several control points j located on the central zone of the transducer, the amplitude and phase the surface acoustic wave $s_j(t)$ generated in the substrate, and storing the measured surface acoustic waves $s_j(t)$ b. computing the transformed signal input $E_i$ and output $S_j$ of the respective input and output signals $e_i(t)$ and $s_j(t)$, c. computing the operator $H_{ji}$ relating all the transformed output signals $S_j$ to all the transformed input signals $E_i$ through the relation $S_j = H_{ji} E_i$ d. determining the signal $E'_i$ such that a transformed swirling surface acoustic wave $S'_j$ at point j is obtained by the relation $S'j = H_{ji} E'_i$ e. computing for each transducer i the electrical input signal $e'_i(t)$ to be applied by inverse transformation of signal $E'_i$ such that a swirling surface acoustic wave swirls in the central zone.

A "transformed signal" is obtained by a mathematical transformation that transforms any convolution operation between two functions into a simple product between these two functions. The mathematical transformation can be chosen among the Laplace transform, the Z-transform, the Mellin transform and the Fourier transform. The Fourier transform is preferred.

Preferably, the method for configuring comprises storing the linear operator $H_{ji}$ and/or the amplitude and phase of each input signal $e'_i(t)$ in a storage unit, linked to or located inside the controller.

Exemplary embodiments of the invention also relate to an optical device comprising the electroacoustic device according to the invention.

The optical device according to the invention may further present one or more of the following optional features:
  the optical device is a microscope;
  in at least one configuration of the optical device, the transducer of the electroacoustic device is located between an objective of the microscope and the support;
  the electroacoustic device is fixed to an objective of the microscope;
  the optical device comprises a plurality of objectives, at least two objectives having different magnifications, at least two, preferably all the objectives being each fixed to an electroacoustic device;
  an electroacoustic device fixed on an objective of the plurality is different from an electroacoustic device fixed on another objective of the plurality.

The present invention also relates to a method for manipulating at least one object in a liquid medium, comprising:
  generating swirling surface acoustic waves with an electroacoustic device comprising a transducer, and
  propagating an acoustical vortex or a degenerated acoustical vortex induced by said surface acoustic waves into the liquid medium for creating therein a radiation pressure wherein said object is submitted, and manipulating the object through displacement of the transducer relative to the medium.

The method for manipulating at least one object in a liquid medium may further present one or more of the following optional features:
  the electroacoustic device is according to the invention;
  the method comprises propagating the volume waves throughout the bulk of a solid support before they reach the liquid medium;
  the transducer is part of a device comprising on a single piezoelectric substrate tracks of at least two respective transducers, preferably interdigitated, having different patterns of electrodes;
  the device is rotatable about a rotation axis, and the method comprises rotating the device before or after using the transducer;
  the method comprises displacing the transducer relative to the medium using at least one electrical actuator;
  the device comprises a visual marking located in the central zone of the transducer, preferably made of the same material as the first and second tracks, the method comprising arranging the electroacoustic device such that the visual marking is offset from the object, following by powering the transducer for generating a volume ultrasonic wave in the liquid medium such as to displace the object for it overlaps the visual marking;
  the method comprises observing the object with an optical device according to the invention;
  the transducer comprises an array of electrode tracks, the method comprising powering the electrode tracks with a single AC source;
  the method comprises inducing a hydrodynamic vortex in the fluid in the vicinity of the object with an acoustical vortex or a degenerated acoustical vortex for changing the orientation of the object;
  the method comprises generating acoustical vortices in the fluid in the vicinity of the object in order to generate torques for inducing rotation thereof;
  the method comprises converging the acoustical vortex or the degenerated acoustical into the liquid medium in a zone plumb with the center of a central zone of the transducer, such as to entrap the object along the direction around which the acoustical vortex or the degenerated acoustical vortex swirls;
  the method comprises inducing a hydrodynamic vortex in the liquid medium;
  the object is a biological material, preferably a cell, the object preferably being label free;
  the method comprises pre-distorting a wavefront of said ultrasonic surface waves so as to control degeneration of the bulk acoustical vortex, the pre-distortion preferably being computed through an inverse filter method of the formula of equation (1).

The present invention further relates to a method for manipulating at least one object in a liquid medium or a liquid medium, notably being a droplet, according to a second aspect, the manipulating comprising at least one of coalescing, deforming, mixing and aliquoting the at least one object and/or the liquid medium, comprising generating swirling surface acoustic waves with an electroacoustic device comprising a plurality of interdigitated transducers powered by respective AC sources and propagating an acoustical vortex or a degenerated acoustical vortex induced by said surface acoustic waves into the medium for creating a pressure trap to which said object and/or said liquid medium is submitted, and varying the AC sources for modifying the location and features of the trap and manipulating, notably displacing or rotating, the object.

The method for manipulating at least one object in a liquid medium according to the second aspect of the invention may further present one or more of the following optional features.

the substrate is such that the ratio of the velocity of a wave along the direction of maximum velocity of the substrate divided by the wave velocity along the direction of minimum velocity of the substrate is greatest than 1.3;

the electroacoustic device is according to the second aspect of the invention;

the method comprises generating a hydrodynamic vortex with the acoustical vortex or the degenerated acoustical vortex, notably for mixing the liquid medium.

BRIEF DESCRIPTION OF THE DRAWINGS

The invention may be better understood from a reading of the detailed description that follows, with reference to exemplary and non-limiting embodiments thereof, and by the examination of the appended drawing, in which.

Figure 1:
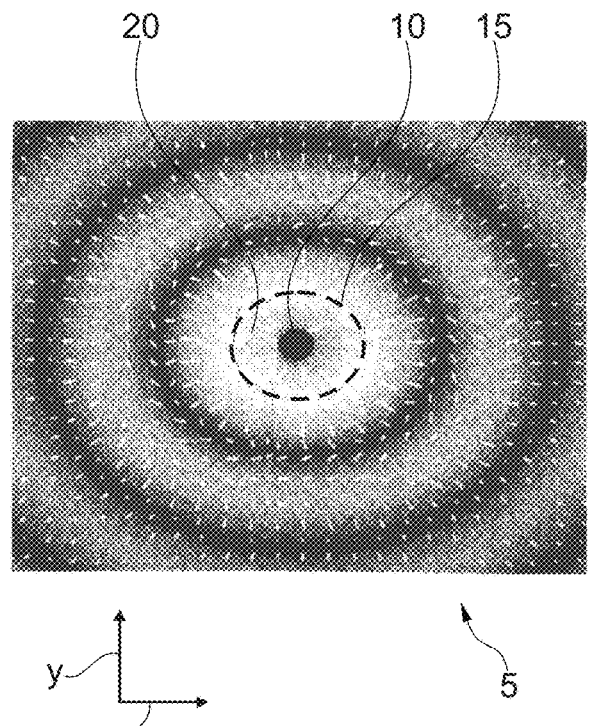
FIG. 1 illustrates the phase and amplitude of a 2D swirling SAW.

In the drawing, the respective proportions and sizes of the different elements are not always respected for sake of clarity.

DESCRIPTION OF SOME EMBODIMENTS

Figure 2:
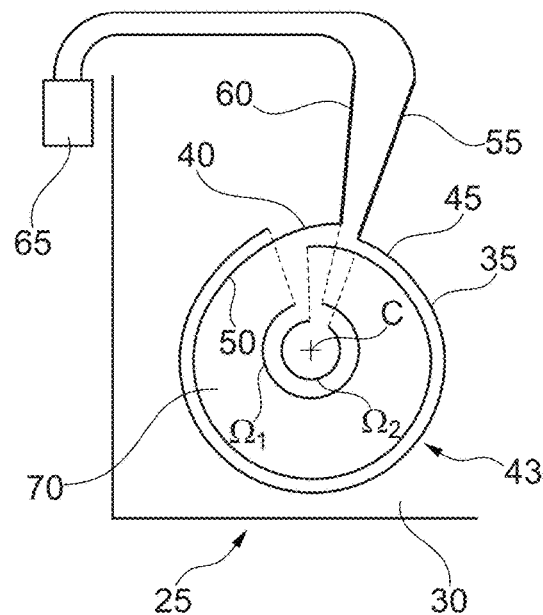
FIGS. 2 to 4 and 9 to 11 illustrate embodiments of an electroacoustic device according to the first aspect of the invention.

FIG. 2 illustrates an electroacoustic device 25 according to the first aspect of the invention, comprising a substrate 30 and first 35 and second 40 electrodes of a transducer 43 disposed on the substrate. The first and second electrodes comprise respective first 45 and second 50 tracks which both spiral around a same center C.

The first and second tracks extend both over angles $\Omega_1$ and $\Omega_2$ greater than 270° around the center, but over different angular sectors. The angles $\Omega_1$ and $\Omega_2$ may be equal or different.

The first and second electrodes comprise respective first 55 and second 60 terminals for being connected to an electrical power supply 65. The first and second tracks are connected to said respective terminals.

The terminals can be made of the same material as the electrodes and during a same deposition process. As an alternative, they can be made of different materials.

The set consisting of the first and second tracks entirely surround a central 70 zone comprising the center C, as shown in FIG. 1. Thus, elementary SAWs are emitted by almost every angular section covered by the first and second tracks, interfering to generate a swirling SAW in the central zone.

The zone where the dark spot of the swirling SAW develops comprises the center C.

Figure 3:
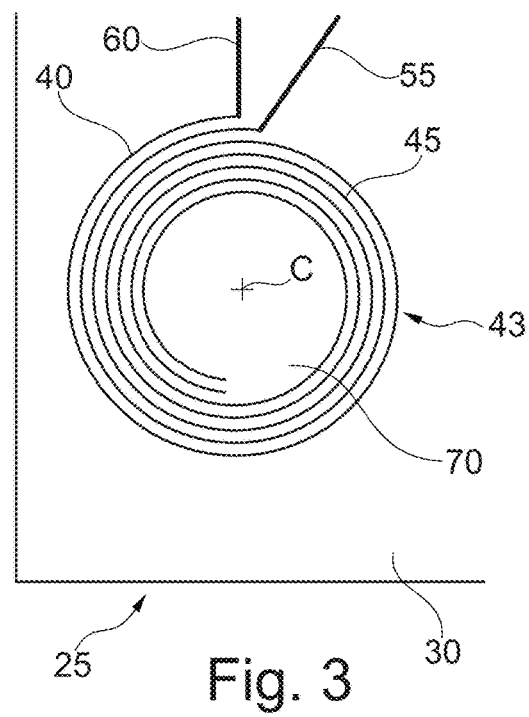

FIG. 3 illustrates an alternative embodiment which differs from the one illustrated in FIG. 2 in that the first and second tracks run along more than two revolutions around the spirals.

Increasing the number of revolutions results in an increase of the acoustic power of the swirling SAW.

Figure 4:
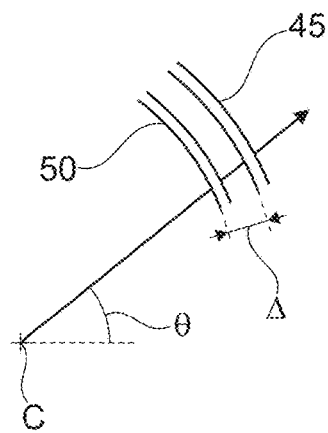

The fundamental wavelength $\lambda$ of the swirling SAW is determined by the distance between two successive first and second electrodes. As shown in FIG. 4, the radial step $\Delta$ between two consecutive first and second tracks is preferably equal to $\lambda/2$.

In the electroacoustic devices illustrated in FIGS. 2 and 3, the spiral is an Archimedes spiral, which is preferable in case the substrate is made of a material which is isotropic as regard to SAW acoustic waves.

As it will appear hereunder, other shapes of the electrode tracks are adapted for propagating SAWs in anisotropic substrates.

Throughout the whole description, and unless stipulated otherwise, the terms "isotropy" and "anisotropy" respectively refer to isotropy and anisotropy with regard to the propagation of a SAW in any material.

In an anisotropic material, the generation of a swirling SAW is complex, since one has to deal notably with direction-dependent wave velocity, coupling coefficient and beam stirring angle. This can modify the way SAW propagating in different directions interfere.

In an anisotropic substrate, the wavelength of a SAW, its velocity and amplitude may depend on the direction along which the SAW propagates.

Furthermore, in case a material such as a support is stacked onto the substrate and is acoustically coupled with it, the swirling SAW can be transmitted in the bulk of support, but the SAW degenerates at the interface between the substrate and the support in an acoustic vortex or in a pseudo acoustic vortex propagating in the bulk of the support. The shape of the SAW, i.e. notably its phase and amplitude in different substrate directions, is also modified by any isotropy mismatch between the support and the substrate. The substrate may be made of an anisotropic material and the support of an isotropic material.

Preferably, each of the first and second tracks spirals along a line defined by the equation (1):

$$R(\Theta) = \frac{\varphi_0 - \omega\mu_0(\Theta) + \alpha(\bar{\psi}(\Theta)) - \frac{\pi}{4}\operatorname{sgn}(h''(\bar{\psi}(\Theta), \Theta)) - l\Theta}{\omega s_r(\bar{\psi}(\Theta))\cos(\bar{\psi}(\Theta) - \Theta)}$$

where:

$R(\theta)$ is the polar distance coordinate of the line with respect to the azimuthal angle $\theta$. In other words it is a distance of the spiral along a revolution at an angle $\theta$ and the center of the spiral;

$\varphi_0$ is a parameter freely chosen to determine the center of the spiral;

l is the vortex order of a swirling SAW of pulsation to, 1 being an integer such that $|l| \geq 1$.

$\omega = 2\pi f$ is the fundamental angular frequency and f is the fundamental frequency of the swirling SAW;

$\alpha(\Theta)$ is the phase of the coupling coefficient of the piezoelectric material constitutive of the substrate; for instance, pure Rayleigh waves have a phase of 0, and pure Gulyaev waves have a phase of $\pi$.

$h(\psi,\Theta) = s_r(\psi)\cos(\psi-\Theta)$ where $s_r(\psi)$ is the phase slowness of the swirling wave and is defined by $s_r(\psi) = k_r(\psi)/\omega$, $k_r(\psi)$ being the norm of the radial component of the wave vector at angle $\Theta$;

the sign ' denotes derivation on variable $\psi$;

function $\overline{\psi}(\Theta)$ is defined by the equation $$\overline{\psi}(\Theta) = \Theta + a\tan 2\left(\frac{s'_r(\Theta)}{\sqrt{s'^2_r(\Theta) + s^2_r(\Theta)}}, \frac{s_r(\Theta)}{\sqrt{s'^2_r(\Theta) + s^2_r(\Theta)}}\right);$$

and the correction term $\mu_0$ corrects the swirl degeneration in the bulk of a stacking of a least one material acoustically coupled with the substrate, when the swirling SAW is transmitted from the substrate to the bulk of said material to propagate as an acoustic vortex or a pseudo acoustic vortex; in order to synthesize the precursor wave that will degenerate into a swirling SAW at the desired height $z_n$:

$$\mu_0(\Theta) = \sum_{i=1}^{n} s_z^{(i)}(\Theta)(z_i - z_{i-1})$$

wherein $s_z^{(i)}(\Theta) = \sqrt{s^{(i)^2}(\Theta) - s_r^2(\Theta)}$ is the phase slowness of the waves in each material (i) of the stacking, $$s^{(i)}(\Theta) = \frac{1}{c^{(i)}(\Theta)}$$

being the phase slowness in the material (i) of the stacking, $c^{(i)}(\Theta)$ being the wave celerity in the material at angle $\Theta$, and $z_i - z_{i-1}$ is the distance between two successive interfaces separating materials stacked onto the substrate, $z_0$ being the height of the interface between the substrate and the layer contacting the substrate, and $z_0$ being the height of the surface of the substrate wherein the swirling SAW is generated.

When no material is coupled with the substrate then $\mu_0(\Theta) = 0$.

The position of a positive electrode track is defined by selecting the angle $\varphi_0$ in equation (1) and the position of the negative electrode track is then defined by the same equation (1) replacing $\varphi_0$ by $\varphi'_0 = \varphi_0 + \pi$.

As it appears clearly in equation (1), although the pattern of a line around which a track spirals can be adapted to a broad range of substrate material and if appropriate to any support material stacked onto the substrate, it is nevertheless specific to a single set of actuation frequency of the device, material properties and thicknesses.

In particular, the pattern shape relies on the frequency of the SAW propagating in the substrate. In case material(s) are stacked onto the substrate so that a swirling SAW is transmitted and propagates in the volume of these material(s) as an acoustic vortex or a pseudo acoustic vortex, the pattern shape also depends on the velocities of the shear and longitudinal bulk acoustic waves in this (these) medium (media).

Figure 5:
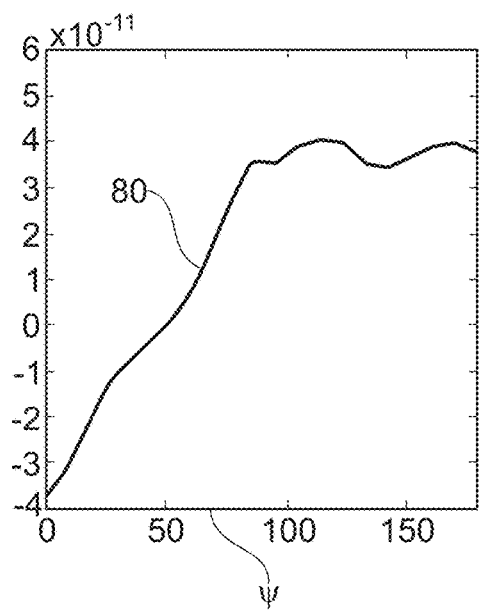
FIG. 5 represents the amplitude of the vertical transverse displacement of a plane front wave in an anisotropic substrate depending on the propagation direction.

As shown in FIG. 5, the amplitude 80 of a plane front SAW in an anisotropic substrate, for instance in a X-cut lithium niobate substrate is dependent on the angle $\psi$ of propagation of the wave in the substrate. The substrate anisotropy therefore affects the wave propagation.

Figure 6:
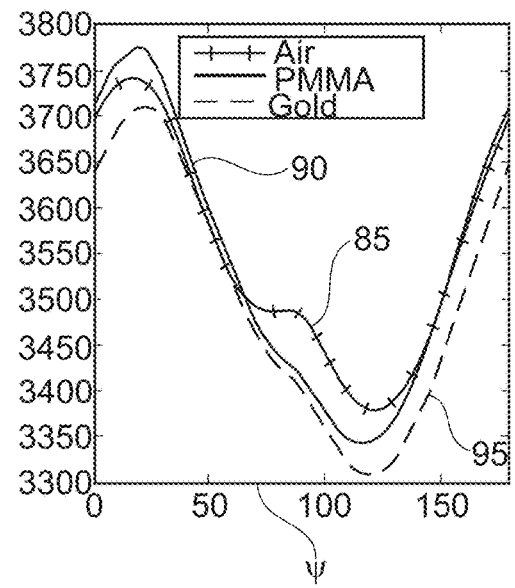
FIG. 6 represents the Rayleigh velocity of a plane front wave in an anisotropic substrate depending on the propagation direction at the interface with different media.

Furthermore, as shown by FIG. 6, the Rayleigh velocity of a plane front SAW at the surface substrate also depends on the direction of propagation of the wave. This dependence is observed whether the substrate surface is free and contacts air (curve 85) or a support, for instance a 2 mm thick polymethylmethacrylate (PMMA) plate (curve 90) or even a gold coating (curve 95) is disposed onto said substrate.

Figure 7:
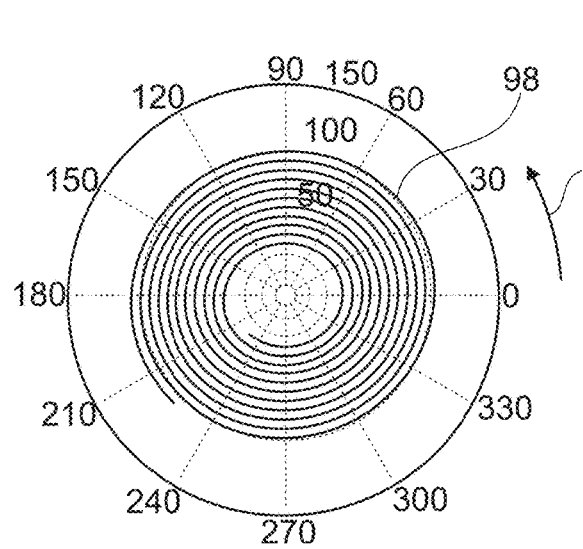
FIG. 7 is a 2D graph of the curve of $\varphi_0 - \omega\mu_0 - l\theta$.

FIG. 7 is a graph representing the correction term $\varphi_0 - \omega\mu_0(\Theta) - l\Theta$ for different values of angle $\Theta$, as indicated along the periphery of the graph. It is required for a swirling SAW swirls in an anisotropic X-cut lithium niobate substrate and be transmitted and propagates in a 2 mm thick PMMA plate support acoustically coupled to the substrate. Values 50, 100 and 150 along a direction at $\Theta = 70°$ on the graph indicate, expressed in radians, of the correction term $\varphi_0 - \omega\mu_0(\Theta) - l\Theta$.

Figure 8:
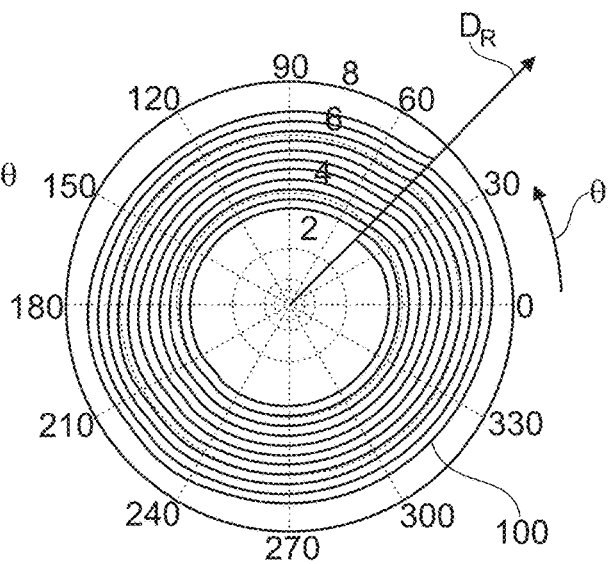
FIG. 8 is a 2D graph of the curve $R(\theta)$ used for defining the tracks of the electroacoustic device of FIG. 9, FIGS. 12 and 14 represent electroacoustic devices according to the second aspect of the invention.

FIG. 8 shows the trajectory of a line $R(\theta)$, expressed in mm, computed from equation (1) for a first order anisotropic swirl (l=1), and for an anisotropic X-cut lithium niobate substrate. Angles expressed in degrees are regularly indicated at the periphery of the drawing. The graph of the line $R(\theta)$ takes into account the evolution of the correction term $\mu_0(\Theta)$, the amplitude and Rayleigh velocity as illustrated on FIGS. 5 to 7. In FIG. 8, one observes at $\theta = 45°$ a steep transition due to a phase change for the first order swirling SAW.

Figure 9:
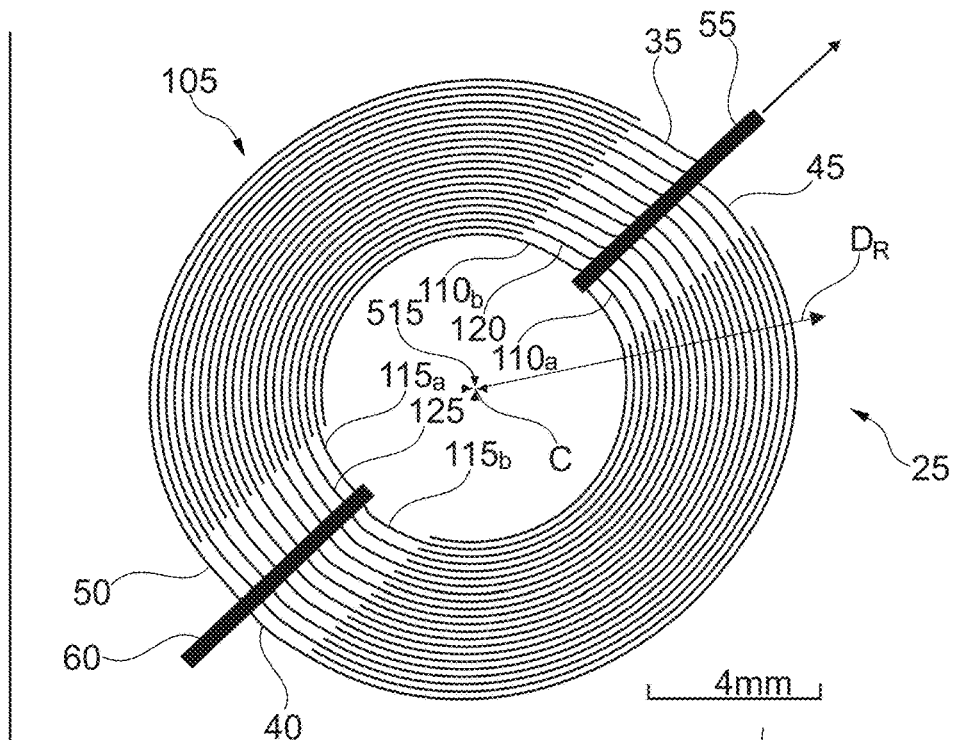

FIG. 9 illustrates an electroacoustic device 25 comprising a transducer 105 having first 35 and second 40 electrodes provided on a substrate 30 and comprising a plurality of respective first 45 positive and second 50 negative tracks. The tracks are provided on the X-cut lithium niobate substrate following equation (1) described here above. The positive tracks are obtained considering an angle $\varphi_0$ in equation (1) and the negative tracks are obtained by replace $\varphi_0$ in equation (1) $\varphi'_0 = \varphi_0 + \pi$.

Thus, the first and second tracks comprise the same center and are distant along a radial direction $D_R$ by a radial step equal to $\lambda/2$.

As it can be observed, the transducer is interdigitated. The first and second tracks are imbricated the ones with the others.

The electrodes comprise first 55 and second 60 power terminals having the shape of straight lines, which are respectively electrically connected to each of the first and second tracks.

For instance, the design of the tracks of the device of FIG. 9 following equation (1) is adapted to generate a swirling acoustic wave in the substrate, and to propagate an acoustic vortex of wavelength equal to 10 MHz in a 2 mm thick support made of PMMA provided on top of the transducer, and coupled by a layer of silicon oil of a few microns height sandwiched in between the substrate and the support. The silicon oil layer achieves a coupling between the substrate and the support while it does not affect substantially the propagation of the acoustic wave since its thickness is much smaller than the acoustic wavelength.

The device according to the invention can be such that a set consisting in several tracks of the first electrode, in particular two tracks 110a,110b as illustrated in FIG. 9, running along a single first spiral winding, and/or several tracks of the second electrode, in particular two tracks 115a, 115b as illustrated in FIG. 9, running along a single second spiral winding, surrounds entirely the center.

In addition, two adjacent first 110b, 120, respectively second 115a,125 tracks can run along two consecutive winding of the first, respectively second spiral.

Furthermore, the first and/or the second power terminals and the plurality of first and/or second tracks of the device of FIG. 9 are arranged such that the first, respectively second electrode track, when observed along a direction normal to the substrate has a shape of a fork.

Figure 29:
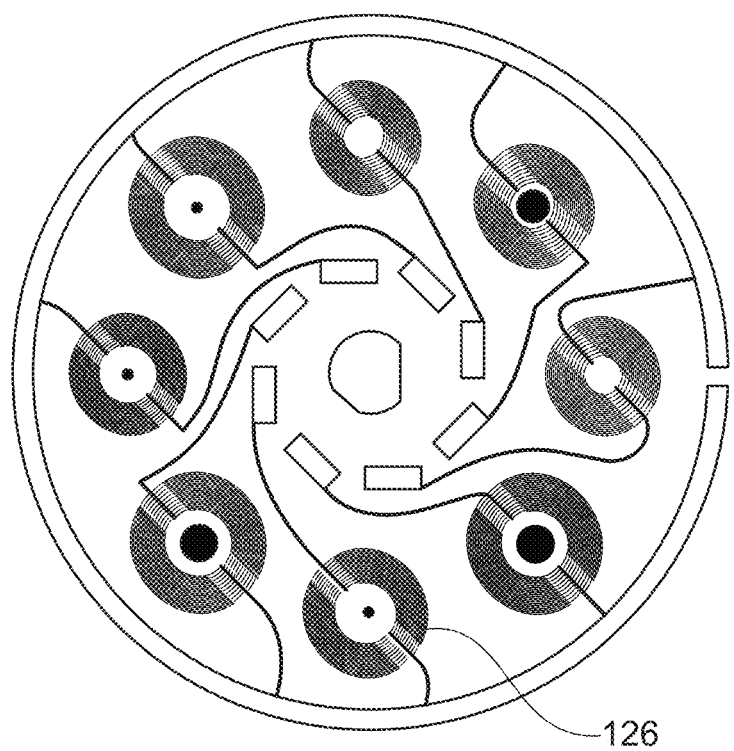
FIG. 29 is a mask for fabrication by photolithography of an electroacoustic device.

A transducer as illustrated in FIG. 9 can be manufactured according to the following method. A X-cut lithium 1 mm thick niobate substrate is polished and cleaned, for instance with acetone-isopropyl-ethanol, and then dried for 1 minute at 100° C. A layer of primer, and then of AZ1512HS resin are deposited by centrifugation at 4000 rpm on a substrate face and is annealed at 100° C. for 1 minute. A mask being the positive of the pattern of the electrodes of the transducer is apposed on the resin. FIG. 29 illustrates a mask 126 for preparing an electroacoustic device comprising a plurality of transducers as it will be described latter. The primer is then exposed to an UV radiation. The substrate is then placed in an evaporator in order to deposit a 50 nm thick chromium layer, followed by deposition of a 200 nm gold layer.

The substrate is then dipped into a bath of acetone submitted to ultrasound emission at 80 kHz at a temperature of 45° C. for 10 minutes.

Figure 10:
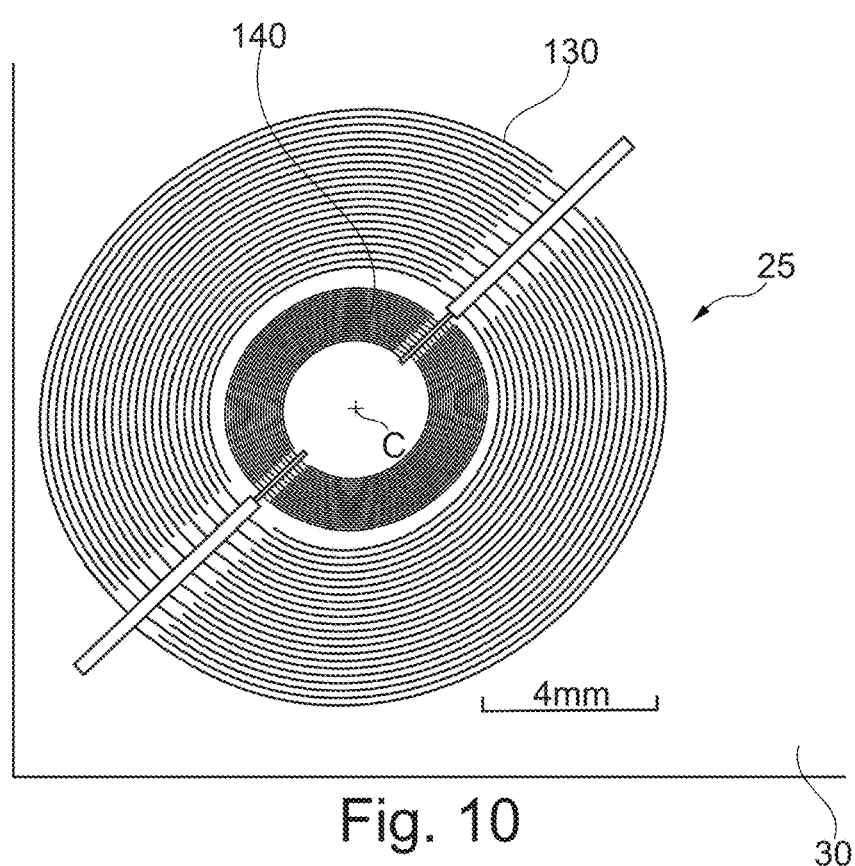

FIG. 10 represents an electroacoustic device comprising first 130 and second 140 transducers configured for generating first and second swirling ultrasonic surface waves of different wavelengths in the substrate, the first and second tracks of each of the first and second transducers spiraling around a same center C. The first and second transducers share the same substrate 30.

The first transducer which is intended for operating at a lower frequency than the second one, surrounds the second transducer.

This specific configuration of the transducers results in a compact electroacoustic device.

The substrate is the same and is oriented in the same direction as the one of embodiment of FIG. 9.

The tracks of the first and second transducers are provided on the substrate both following respective lines of equation (1) as described here above. The parameters of equation (1) are chosen such that the first and second transducers generate a swirling SAW in the substrate at respective fundamental frequencies of 10 MHz and 30 MHz, swirling around an axis passing through center C and perpendicular to the substrate, with respective first and second opposite spins.

First and second opposite spins are obtained by choosing respective appropriate swirl orders 1 of respective values +1 and −1 in equation (1).

The device illustrated in FIG. 10 is particularly well suited for any application where the torque induced by the swirling SAW in the object to be manipulated has to be controlled.

In particular, the track pattern of the electrodes is configured for an acoustic vortex or a pseudo acoustic vortex to be transmitted by the substrate and propagates into a 150 µm thick borosilicate glass slice acoustically coupled with the substrate.

Figure 11:
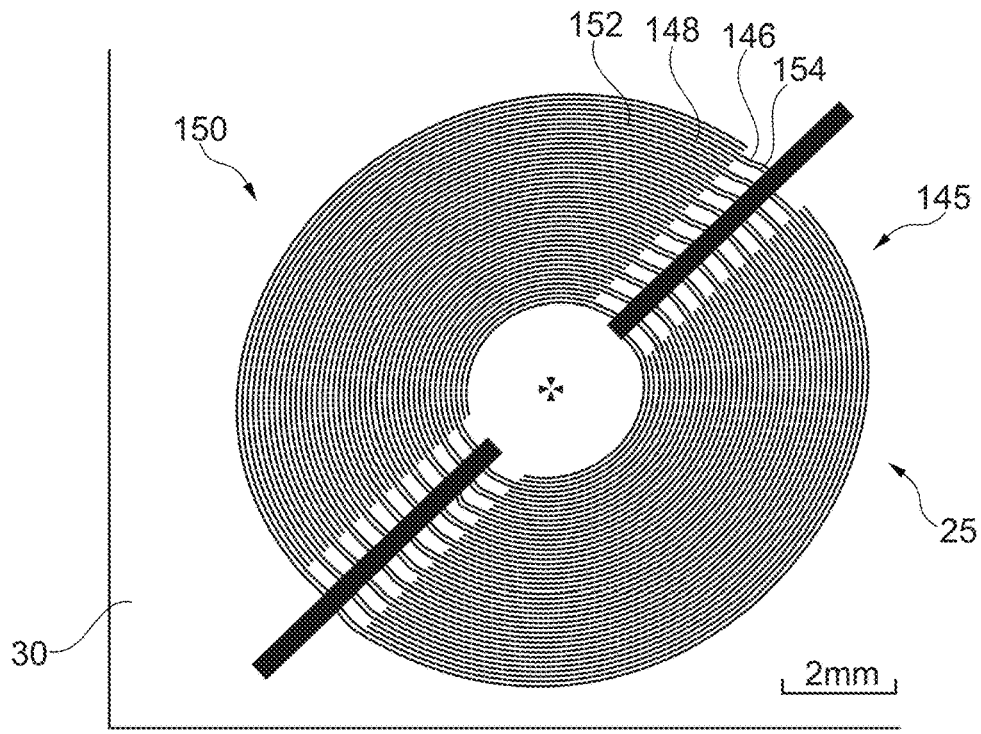

FIG. 11 illustrates an electroacoustic device 25 comprising a transducer comprising two sets 145, 150 of first and second electrodes. The substrate 30 is the same as in examples of FIGS. 8 and 9.

The first set 145 comprises first and second electrodes labeled 146 and 148 and the second set 150 comprises first and second electrodes labeled 152 and 154. Each of the first and second electrodes comprise first and second pluralities of tracks which follow a line of general equation 1. This electroacoustic device takes advantage that the order of the swirl is proportional to the frequency of the electrical input signal. The first, respectively the second plurality of tracks spirals along a line which equation is computed considering a swirl order l equal to 1, respectively equal to 3.

Thus the transducer of the electroacoustic device illustrated in FIG. 11 is adapted to generate signals operating at two fundamental frequencies of 10 MHz and 30 MHz respectively.

In particular, the electroacoustic device is such that two consecutive first tracks along a radial direction are alternate in the radial direction with two consecutive second tracks of the second electrode.

The device illustrated in FIG. 11 is notably well adapted for generating a steady like current around the transducer center which makes it possible to mix fluids or manipulate very small particles that would not be trapped by a swirling SAW having only a single fundamental frequency.

Figure 12:
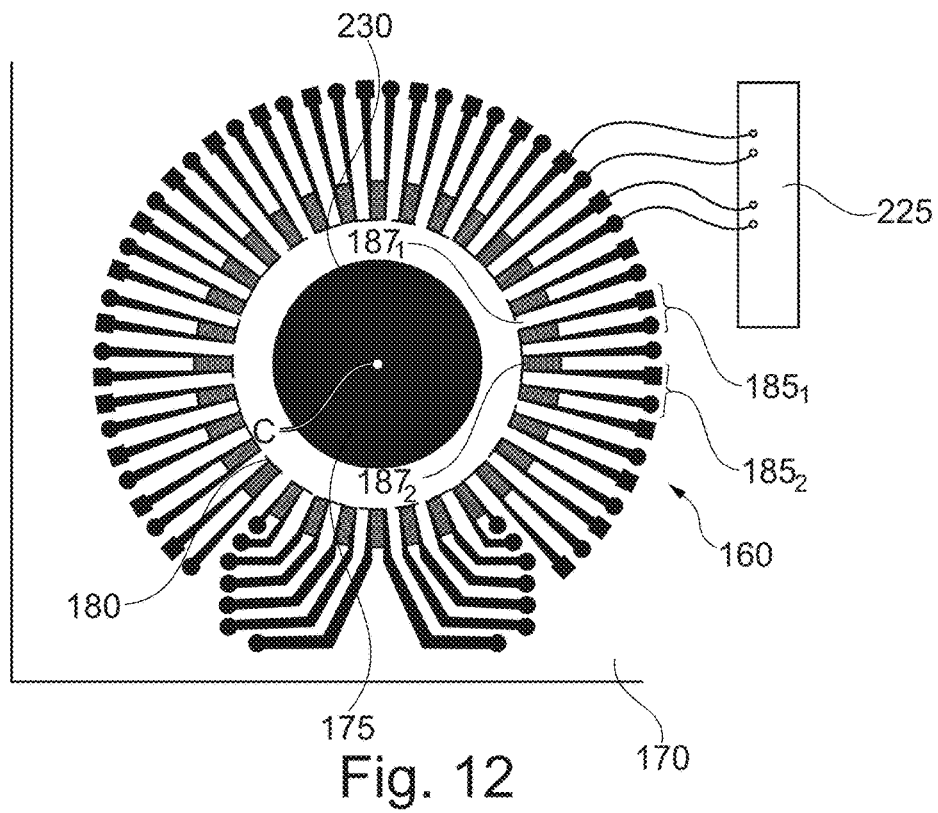

FIG. 12 represents an electroacoustic device 160 according to the second aspect of the invention.

It comprises a substrate 170, preferably an anisotropic X-cut lithium niobate crystal, having a central zone 175 which perimeter is delimited by a circle 180 (illustrated in dash line on FIG. 12). Interdigitated portions of thirty two unidirectional transducers $185_1$ and $185_2$ (only two of them being labeled), preferably SPUDT interdigitated transducers, are provided onto the substrate around the central zone 175. The interdigitated portions $187_1$, $187_2$ are regularly spaced along the circular perimeter of the central zone. The number of transducers is not limited to thirty two. It is however preferred to be at least four. A highest number is preferred, since it provides a more uniform spatial coverage of the central zone and enables a better synthesis of the targeted wavefield. A high number of surface waves interfering improve the generation of a swirling SAW.

Figure 13:
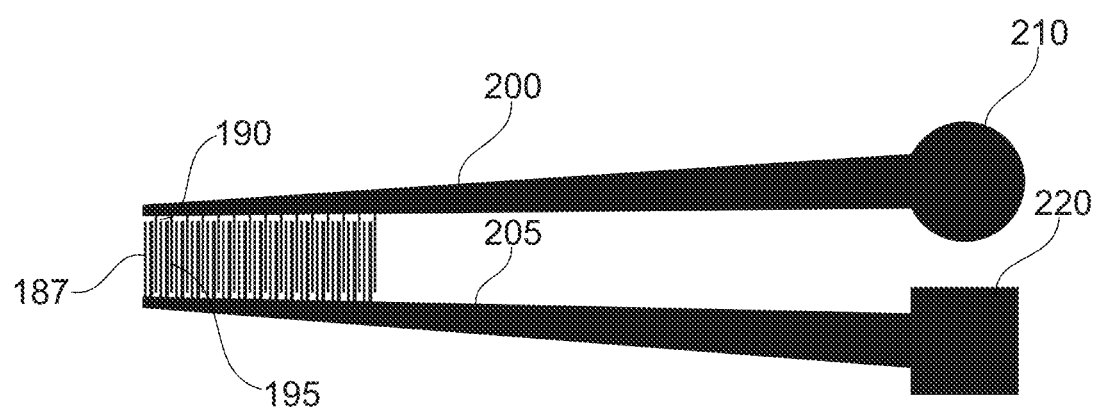
FIGS. 13 and 15 are respective magnified views of interdigitated portions of the transducers of FIGS. 12 and 14.

As shown in FIG. 13, each interdigitated portion 187 is composed of interdigitated first and second tracks of respective first 190 and second 195 electrodes of inverse polarity. At least one track of each interdigitated portion is tangent to the circular perimeter. Furthermore, as shown in FIG. 13, the first and second tracks are parallel the ones with the others. The width of the first and second tracks may be different or equal.

Each transducer further comprise first 200 and second 205 electrodes which comprise the tracks or the interdigitated portions as described hereabove to which are connected respective first 210 and second 220 power terminals. The first and second electrodes of each transducer are electrically connected via the power terminals to a controller 225. In the drawing, for sake of clarity, only two sets of electrodes are shown as being connected but in practice, all the thirty two transducers are.

In the embodiment of FIG. 12, the central zone is covered by a gold layer 230 which is intended to serve as a mirror for measuring the amplitude and phase of the swirling SAW in the central zone with a Michelson interferometer.

In the electrical device of FIG. 12, every transducer is configured for generating a standing SAW which propagates through the substrate, at a frequency that is of 12 MHz. The SAWs emitted by the thirty-two transducers interfere in the central zone. As it will be more apparent hereafter, the controller is configured to control each of the transducers such that the interference of the SAW generates a SAW swirling in the central zone.

Figure 14:
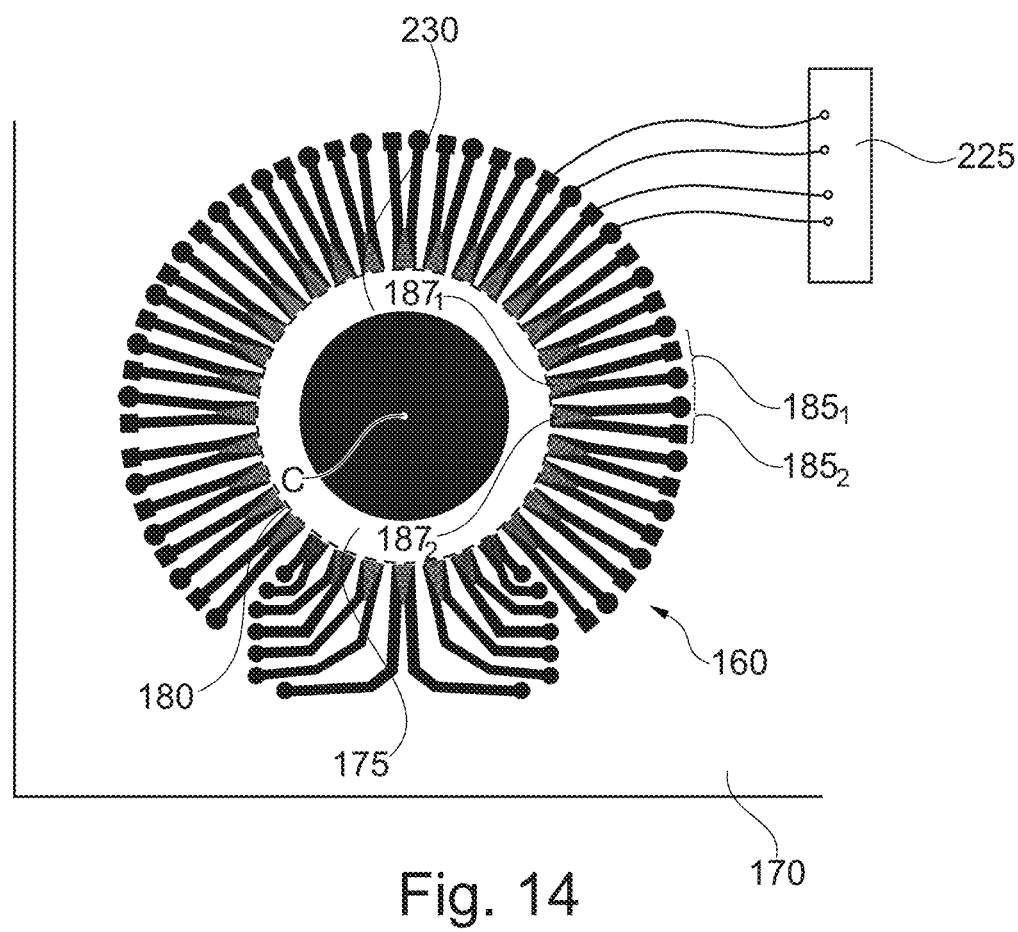

FIG. 14 represents a variant of the electroacoustic device 170 of FIG. 12. It differs notably from the latter in that the perimeter 180 of the central zone 175 is not a circle but follows a line homothetic to the wave surface of a SAW of planar front propagating in the substrate.

Figure 15:
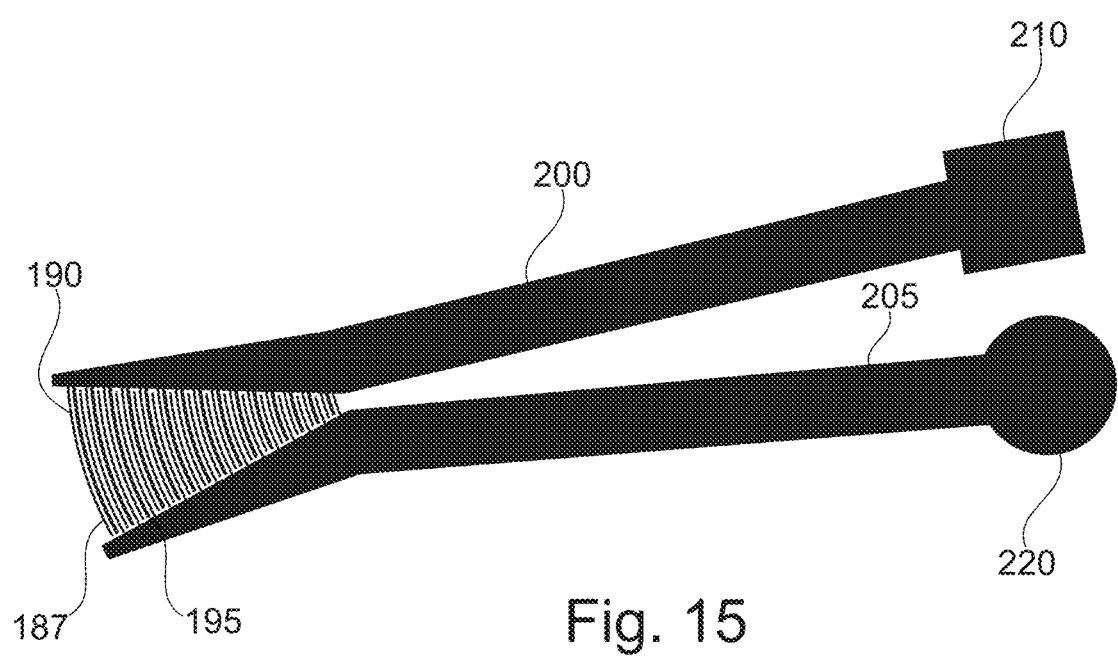

The embodiment of FIG. 14 differs also from the one of FIG. 12 in that the first and second tracks are curved, as shown in FIG. 15. The curving of the tracks promote wave diffraction, especially in an anisotropic substrate. This improves the illumination by each transducer of the central zone of the substrate, which has for example a radius of 5 mm. This improvement allows to achieve a synthesis of a wide variety of acoustic wave fields, such as focalized SAW, plane propagating SAW and notably of swirling SAW.

The specific curving of the tracks is performed following the teaching of the article "*Subwavelength focusing of surface acoustic waves generated by an annular interdigital transducer*", Laude et al., Applied Physics Letters 92, 094104 (2008).

The controller 225 of the device according to some embodiment of the invention is configured to control each of the transducers such that the emitted SAWs interfere in the central zone to generate a swirling SAW therein.

In particular, the controller powers each transducer by sending to it an electrical input signal. Preferably, the controller comprises a storing unit wherein parameters of input signals to be sent to each transducer are stored. Preferably, the input signal is an AC electrical signal, and the parameters are the maximum intensity and phase of the input signal.

Preferably, a method for configuring is implemented before the first use of the electroacoustic device, for instance such as shown on FIGS. 12 and 14.

Figure 16:
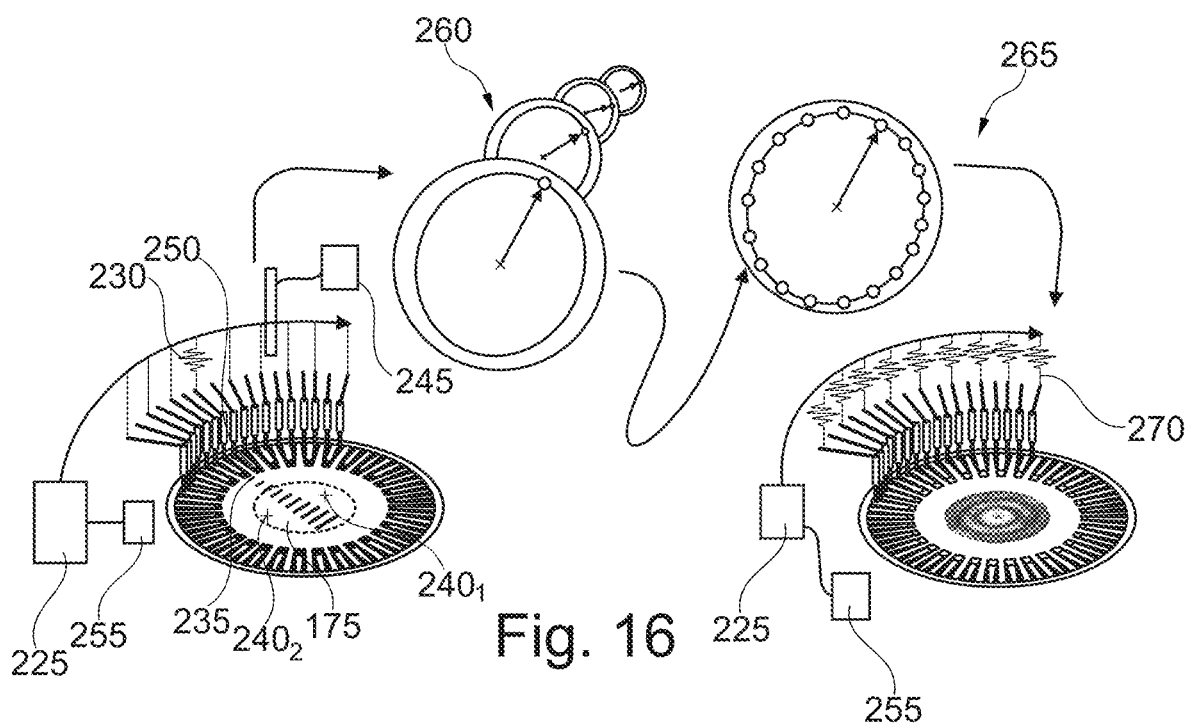
FIG. 16 is a scheme illustrating the method of configuring the electroacoustic device.

This method for configuring, also named "inverse filter method", is illustrated on FIG. 16.

An electrical signal 230 $e_i(t)$, preferably an impulse signal, is sent by the controller to a single transducer 235 i among the set of transducers surrounding the central zone. The transducer converts this electrical input signal into a SAW which propagates into the central zone 175. The controller is configured such that the electrical circuits relying the other transducers to the controller are opened. Thus no input signal is sent from the controller to the other transducers.

The SAW emitted by transducer i in the substrate $s_j(t)$ is measured at each several control points j located in the central zone. Preferably, the number of control points $240_1$, $240_2$ is at least 2, even preferably at least 4, even preferably at least 10, even preferably at least 100, even preferably at least 200. As an illustration, 400 control points can be distributed on a surface of 1×1 cm². Preferably the distance between two control points is less than $\lambda/2$, $\lambda$ being the wavelength of the standing SAW emitted by transducer i. Preferably, the control points are regularly distributed in the central zone.

The amplitudes and phases of the SAW $s_j(t)$ at all points j are preferably measured with a Michelson interferometer 245, whose one arm can be focalized on any control point j. In case the substrate is made of lithium niobiate, it is preferred to cover the central zone with a gold layer which serves as a mirror to reflect the beams and improve the quality of the measurements.

After the input signal has been emitted, the controller switches off the transducer i and sends an input signal $e_k(t)$ to transducer 250 k. The SAW $s_j(t)$ are then measured at control points j.

The input signals $e_i(t)$ of all successively powered transducers i and the SAWs $s_j(t)$ can be stored in a storing unit 255.

The input signals $e_i(t)$ and measured amplitude and phase of the SAWs $s_j(t)$ can be related by the relationship $$s_j = \Sigma_i h_{ij} * e_j,$$

where * refers to the convolution product and $h_{ij}$ is the time response at control point j to an input signal $e_i$ emitted by transducer i. In the spectral domain, $H_{ij} = \mathcal{F}(h_{ij})$ is the Fourier transform of the transfer function at control point j of transducer i.

Using a matrix formalism, where E and S are vectors comprising the respective Fourier transforms $E_i$ and $S_j$ of signals. $e_i(t)$ and $s_j(t)$, and H is the matrix form of operator $H_{ij}$, the linear following relationship is obtained:

$$S = H \cdot E$$

Then, using well known classical pseudo matrix inversion techniques, a vector E' can be computed 260 for obtaining a vector S' corresponding to the Fourier transform of a Fourier swirling SAW at all control points j.

Finally, each component of the vector E', which corresponds to the Fourier transform of the input signal $e'_i(t)$ to be emitted by each transducer i to generate a swirling saw can be obtained by inverse Fourier transform 265.

Once the method for configuring is completed, the controller is then configured for powering jointly several, preferably all the transducers, and for sending every transducer an output signal e'(t) 270. Each input signal has preferably its own features, such as specific phase and/or amplitude which are different between at least two emitting transducers. The interference in the central zone of the SAWs emitted by each of the transducers thus generates a swirling SAW in the central zone of the substrate.

Figure 17:
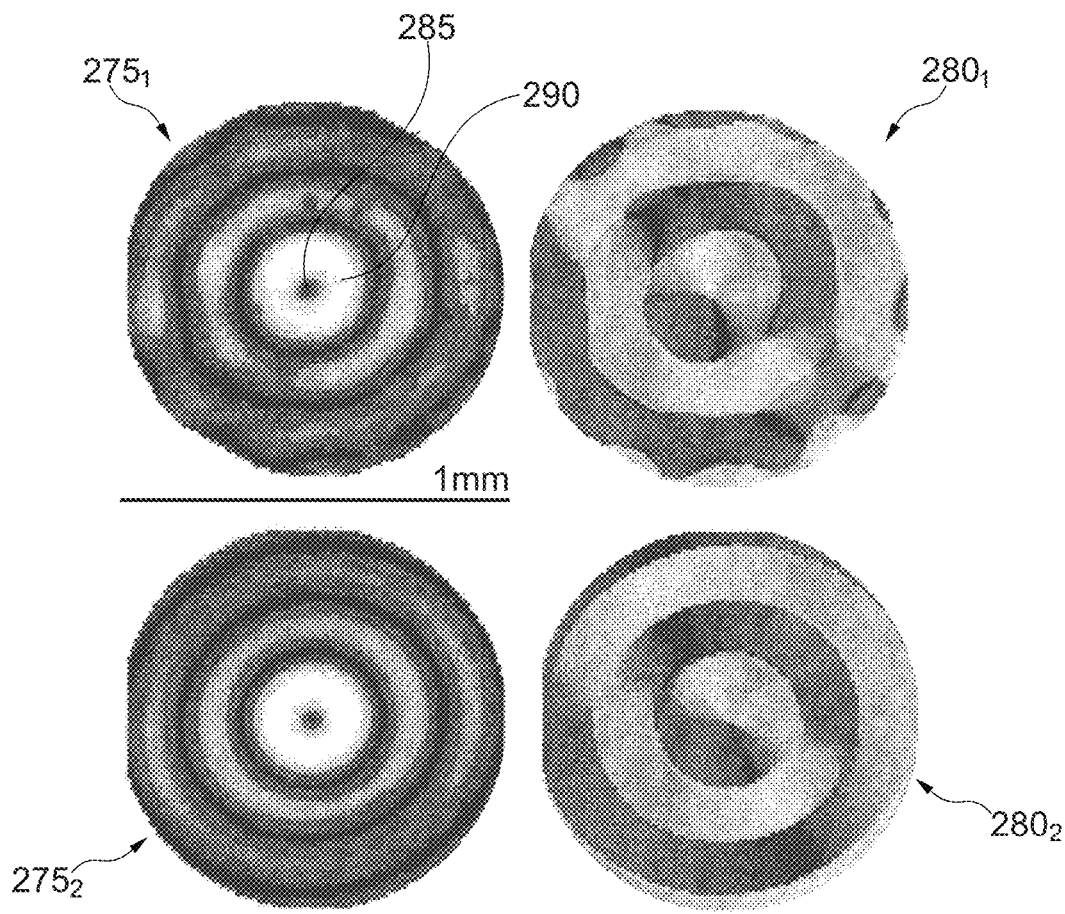
FIG. 17 illustrates measured and corresponding theoretical predicted phase and amplitude of a swirling SAW generated with an electroacoustic device according to some embodiment of the invention.

FIG. 17 illustrates the amplitude $275_1$ and phase $280_1$ of a first order Bessel wave swirling SAW generated with the electroacoustic device of FIG. 12, which has been set by the method for configuring according to the invention. The amplitude and phase have been measured with a Michelson interferometer.

A dark spot 285 of 50 µm size is visible at the center of the swirl and matches with a phase singularity. The dark spot is contrasted by bright concentric rings. The theoretical amplitude $275_2$ and phase $280_2$ are also represented for comparison. A correct matching between theoretical and experimental swirls is achieved on both the amplitude and phase.

Figure 18:
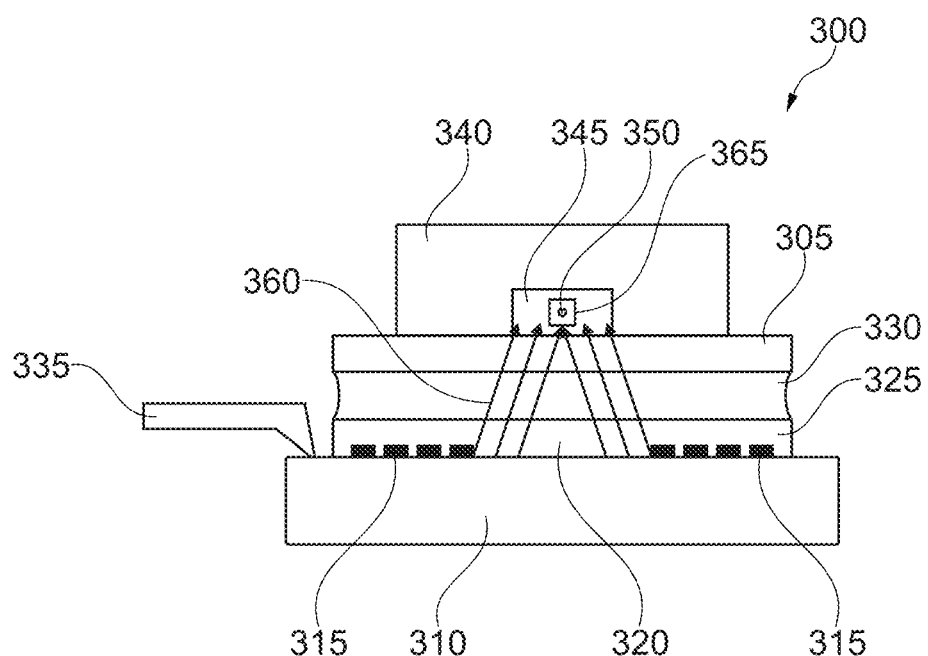
FIGS. 18 to 23 show two variants of electroacoustic devices according to some embodiments of the invention.

FIG. 18 illustrates an electrical device 300 according to some embodiment of the invention, comprising a support 305 overlapping the substrate 310. The support can overlap the electrodes 315 or it can only overlap the central zone 320.

Furthermore, the support can be removable from the electroacoustic device.

The tracks of the transducer can be located in between the substrate and the support.

The support is preferably chosen among a glass and a polymer, preferably a thermoplastic, most preferably polymethylmethacrylate (PMMA). Preferably, the support is made of material comprising glass.

Preferably, the material of the support is isotropic. Preferably, it is not piezoelectric.

In order to protect the tracks from friction by the support and prevent from damage, the transducer is at least partially, preferably totally covered by a protective coating 325, preferably comprising silica. Preferably, the protective coating thickness is less than $\lambda/20$, $\lambda$ being the fundamental wavelength of the swirling SAW. Thus, the transmission of the swirling SAW unaffected by the protective coating.

Preferably, for optimum transmission of acoustic waves, a coupling fluid layer 330, preferably made of a silicon oil, is sandwiched in between the support and the substrate. Preferably, the thickness of the coupling fluid layer is less than $\lambda/20$, $\lambda$ being the fundamental wavelength of the swirling SAW. Thus, the transmission of the swirling SAW is unaffected by the coupling fluid layer. Silicon oil is preferred since it has a low dielectric constant and since it does not molder. Furthermore, the coupling fluid allows easy displacement of the support relative to the substrate.

Electric brushes 335 are in contact with the electrodes for supplying power to the transducer.

As illustrated, the electroacoustic device can also comprise a cover 340 provided onto the support, and comprising a groove 345 defining a chamber, preferably made of PDMS, for instance having the shape of a microchannel configured for housing a liquid medium comprising an object 350 to be manipulated.

Preferably, in the embodiment of FIG. 18, the swirling SAW is a generalized Rayleigh wave. Preferably, the thickness of the substrate is greater than $10\lambda$, $\lambda$ being the fundamental wavelength of the swirling SAW.

As described previously, the pattern of the tracks of the electrodes can be designed such that the swirling SAW generated at the surface of the substrate be transmitted and swirls 360 as an acoustic vortex or a pseudo acoustic vortex in the support up to reach the liquid medium and the object.

Preferably, in case the support is made of an isotropic material, the pattern of electrodes is such that the degeneration of the swirling SAW generated by the transducer at the interface between the substrate and the support achieves an acoustic vortex or a pseudo acoustic vortex with an associated radiation pressure which concentrates in a volume represented as a square 365 located perpendicularly to the substrate and overlapping over the center of the central zone of the transducer. An object located in the vicinity of said volume and having a size comparable to the wavelength of the swirling SAW, also named "3D trap" is submitted to attraction forces which aims at entrapping said object in the volume. Notably, any displacement in the trap is limited, in all the three space dimensions.

Figure 19:
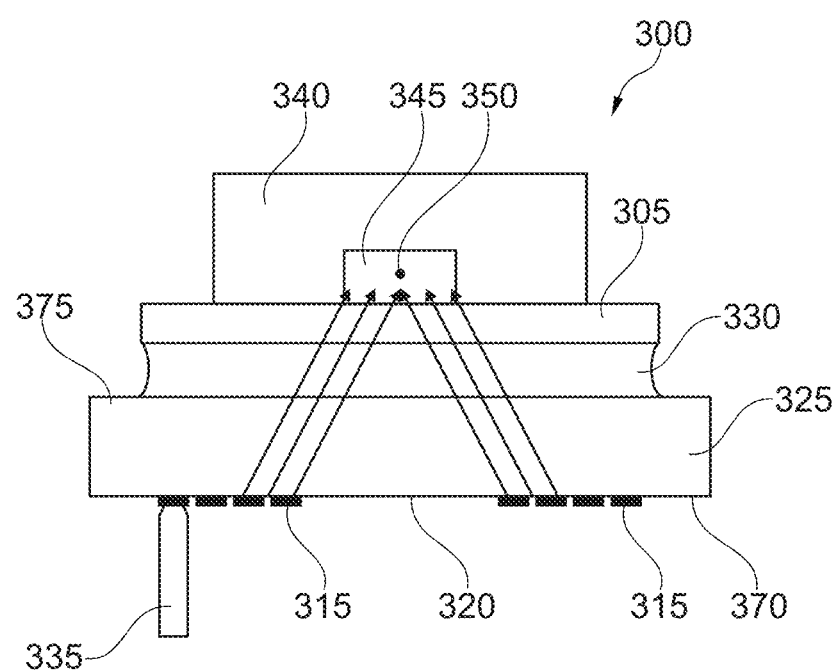

In a variant represented in FIG. 19, the tracks of the electrodes can be disposed on a face 370 of the substrate which is opposite to the face 375 facing the support. Preferably, in the embodiment of FIG. 19, the swirling wave is either a Lamb wave or a bulk wave.

In case it is a Lamb wave, the thickness if the substrate is lower than $\lambda/2$, $\lambda$ being the fundamental wavelength of the swirling SAW. This solution requires thinner substrates as the frequency increases.

Notably when the Lamb frequency would yield too thin a substrate, for instance of thickness of less than 200 µm, the pseudo acoustic vortex can be directly generated in a thicker substrate. It can be either a bulk longitudinal wave pseudo acoustic vortex or a bulk shear wave acoustic vortex radiating in the thickness of the substrate at a fixed angle. The step between first and second tracks can be selected in order to match with the projection of the wavelength.

Advantageously, in the embodiment of FIG. 19, the transducers are protected from any damage by the support are from any pollution caused by the coupling fluid. Furthermore, the face of the substrate which is contact with the support can be easily cleaned without any risk of damaging the electrodes, when the support is removed from the substrate. A device having tracks provided on the face opposite to the support as in FIG. 19 can comprise a high conductive coupling fluid of a high dielectric constant coupling fluid, such as a water based gel, without the coupling fluid influencing negatively the swirling SAW generation and propagation.

Furthermore, the electrical connections, such as contact brushes can be provided on the same side as the tracks, which simplifies the manufacturing of the device, and makes it more ergonomic to the user.

Figure 20:
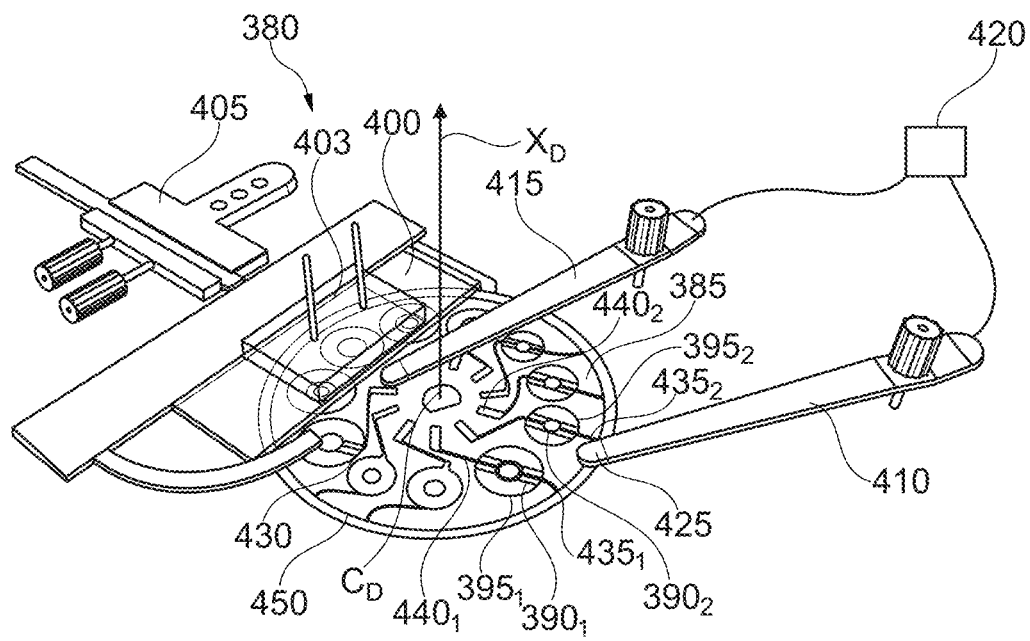

FIG. 20 describes a variant of the electroacoustic device 380 according to the first aspect of the invention which comprises a substrate 385, which is disk shaped of center $C_D$. The substrate comprises a plurality of electrode patterns $390_1$, $390_2$ provided on the substrate defining a plurality of transducers $395_1$, $395_2$. Preferably, as illustrated, the transducers are regularly provided around the center of the disk.

The electroacoustic device further comprises a support 400 which is preferably non opaque, and more preferably transparent. The support partially overlap the substrate. The support and the transducers are provided such that in at least one position of the device, at least one of the transducer is entirely overlapped by the support. Preferably, as illustrated in FIG. 18, the tracks are provided on the face of the substrate that is intended to face the support.

A cover 403 is disposed on the support.

The substrate is provided rotatable around an axis $X_D$ passing through the center $C_D$ of the disk. In particular, the electroacoustic device is configured such that, by rotating the substrate around axis $X_D$, each transducer among the plurality of transducer can be positioned such as to be overlapped by the support and, notably by an object to be manipulated provided on the support.

Moreover, as illustrated, the electroacoustic device can comprise a micro-manipulator 405, connected to the support, which allows for a precise positioning by translation of the support relative to a transducer, preferably along two perpendicular axes preferably parallel to the substrate. The micro-manipulator can be fixed to an optical device such as a microscope.

Furthermore, the electroacoustic device comprises outer 410 and inner 415 contact brushes for electrically powering the electrodes. It can also comprise a power supply device 420 to which the contact brushes can be electrically connected. Preferably, the ends 425, 430 of the contact brushes intended for contacting the electrodes can be fixed with regard to the substrate. In particular, they can be provided at a constant polar coordinate relative to center of the substrate.

Each electrode of the plurality comprises a first $435_1$, $435_2$ and second $440_1$, $440_2$ power terminal. All the power terminals of the electrodes of a same polarity are preferably provided radially on a same side of each transducer. As illustrated in FIG. 20, the power terminals of the respective first and second electrodes of the transducers are respectively radially outside and inside of the tracks of the electrode. In addition, all power terminals of the first electrodes are electrically connected to a common power track 450, which extends, preferably around a circle, at the periphery of the substrate.

The outer contact brushes are preferably in contact with the external track. By the way, when the user of the device rotates the substrate such as to place a specific transducer such as it faces the support, the electrical contact between the first electrode and the outer contact brush of said transducer is achieved with no move of the outer contact brush.

Preferably, each of the second power terminals of one of the transducers is provided such that, when the substrate is rotated around the axis $X_D$ in order that the transducer faces the support, the second power terminals is in electrical contact with the inner contact brush.

Advantageously, the electroacoustic device illustrated in FIG. 20 requires a single power supply device and a single contact brushes pair to successively power each transducer. It does not require any complex control system with expensive electronic devices and is therefore cheaper than electroacoustic devices of the prior art. In addition, as described here above, manufacturing of the electrical device comprising several transducers can be performed by photolithography which is substantially inexpensive, for instance with the mask 126 as illustrated in FIG. 29.

Furthermore, the device is easy to use, since the user can select any transducer of the device by a simple rotation operation. Besides, as it can be observed on FIG. 20, each transducer is visible by the user which facilitates its initial positioning prior to manipulation of an object.

Figure 21:
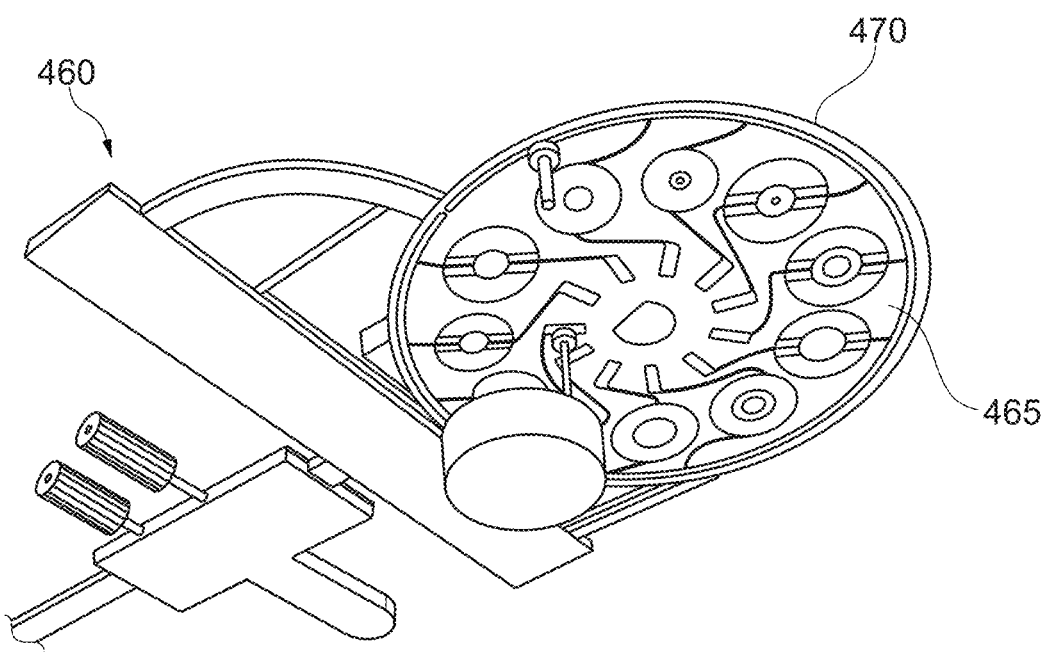

As a matter of illustration, FIG. 21 shows an electroacoustic device 460 which differs from the one of FIG. 20 by the fact that the electrode tracks are disposed on the face 465 of the substrate 470 opposite to the one that faces the support, as already illustrated in FIG. 19.

Figure 22:
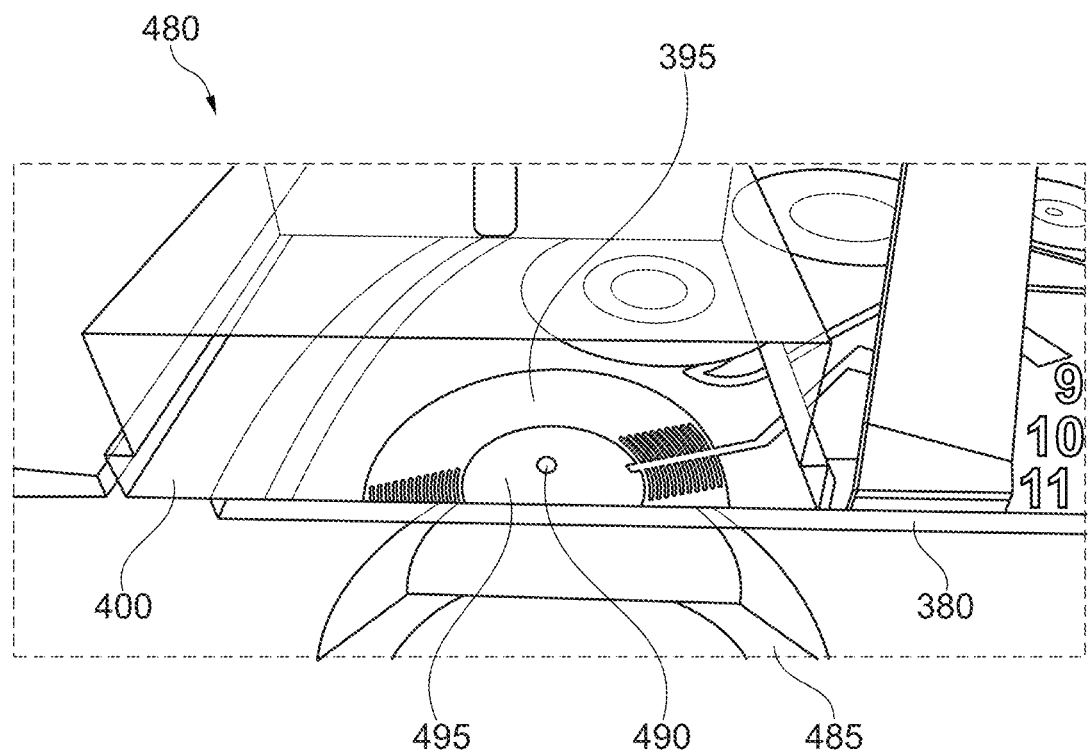

FIG. 22 shows a crop of a microscope 480 comprising the electroacoustic device 380 of FIG. 20. The electroacoustic device is fixed onto the microscope deck, such that a zone of the support, on which an object to be manipulated is disposed, overlaps an objective 485 of the microscope.

The optical device allows observation of an object 490 trapped in the central zone 495 while being manipulated by the electroacoustic device.

Figure 23:
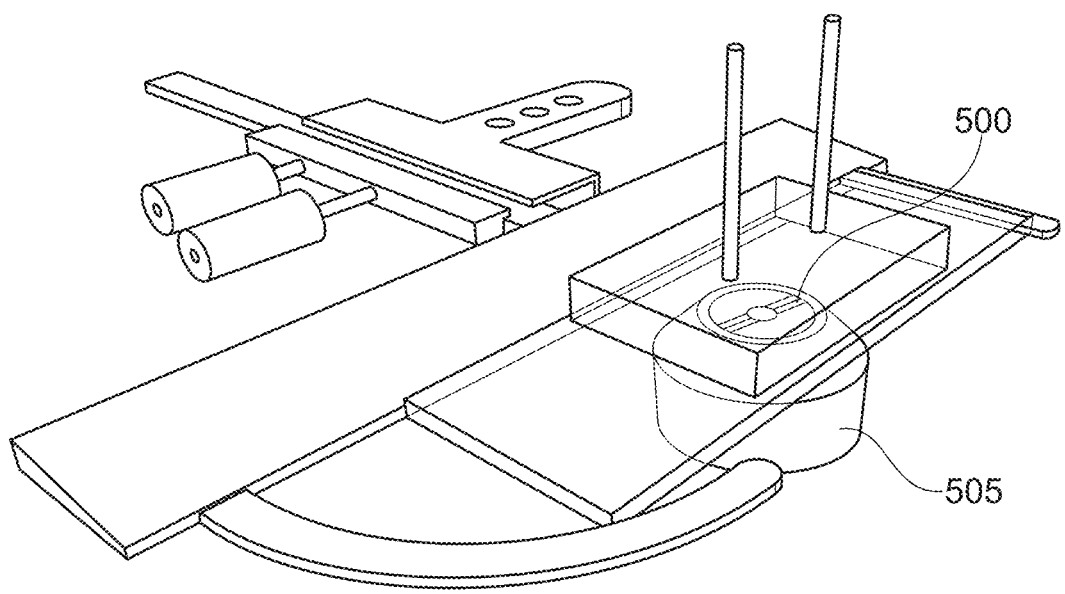
Figure 24:
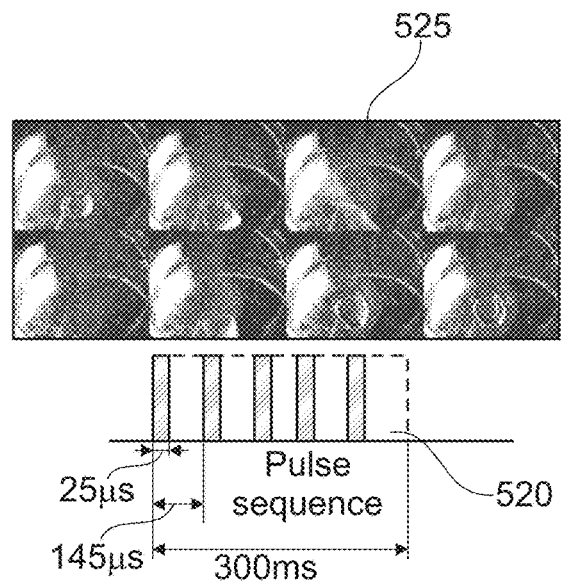
FIGS. 24 to 28 are pictures showing different objects manipulations.
Figure 25:
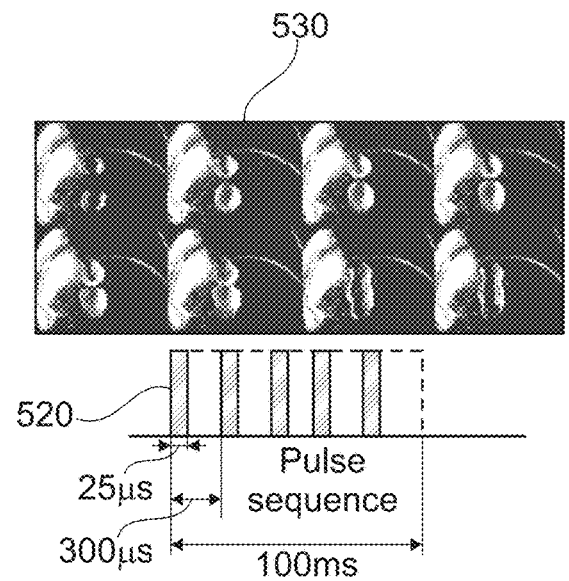
Figure 26:
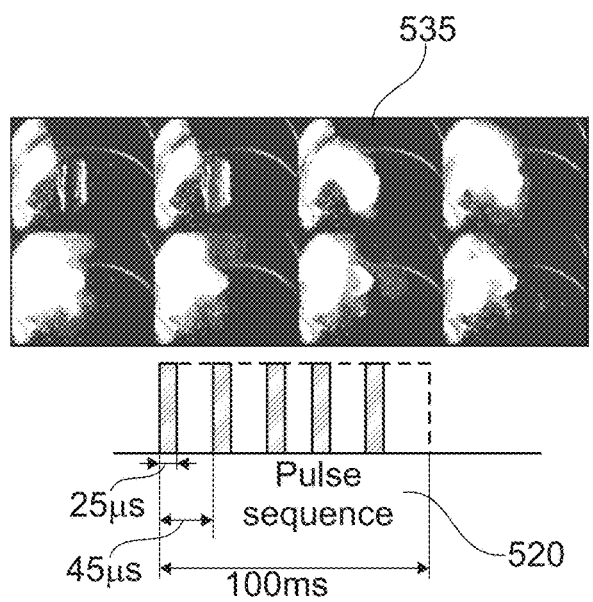

In the variant of FIG. 23, the transducer 500 of the electrical device of the invention is disposed on an objective 505 of the optical device. As objective magnification is directly related to the size of the object intended to be manipulated, the transducer disposed on the objective is preferably adapted to manipulate an object which can be entirely observed with the objective. Preferably, a single transducer is disposed on the objective.

The transducer can be provided on the outer lens, notably the protection lens of the objective. It can also be provided in an inner lens of the objective. Preferably, the substrate of the electrical device is in the form of a coating made of a piezoelectric material (such as AlN, ZnO) deposited on the objective, preferably having a thickness related to the frequency used by the electrical device to optimize the generation efficiency, on top of which electrodes are disposed, preferably being deposited by photolithography. The objective may comprise means for powering the transducer.

In a variant, the substrate can be disposed on a base which is configured to be fixed to the lens. The base can comprise a part made of a non-opaque, preferably transparent material on which the substrate is deposited as a layer.

Preferably, a coupling fluid is sandwiched in between the objective and the support.

In the embodiment of FIG. 23, a swirling SAW generated by the transducer can be propagated, and be transmitted as an acoustic vortex or a pseudo acoustic vortex for instance through an immersion oil wherein the lenses of the objective are embedded.

In a preferred embodiment, the optical device comprises the electroacoustic device according to the first aspect of the invention.

The embodiment as exemplified in FIG. 23 makes the optical device more compact and manipulation of the object is made easier. Further, it reduces issues related to light propagation which might be encountered in substrates having a thickness of greater than 1 mm.

Furthermore, the optical device can comprise a plurality of objectives, each objective comprising an electroacoustic device according to the invention, the electroacoustic devices being different the ones from the other. Preferably, each transducer has a pattern of electrodes which differs from the pattern of electrodes of at least, preferably all the transducers of the plurality. For instance, it is thus possible to successively change the objective of the plurality such as to trap an object in respectively smaller and smaller traps.

The electroacoustic device, for example comprised in an optical device such as the microscope as illustrated in FIG. 22, might be used, for instance, as follow:

A user can dispose a liquid medium comprising an object on top of the support. Then, he may firstly position the liquid medium as to be overlapped by the field of view of the objective, for instance by translating the support with the micro-manipulator.

Then he might choose the transducer which is adapted for the intended object manipulation, for instance chosen among displacement, mixing, coalescing and aliquoting. As described previously, the fundamental frequency of a swirling SAW is defined by the electrode patterns of the transducer. A man skilled in the art knows how to choose an appropriate frequency depending on the size of the object to be manipulated.

The user might then rotate the substrate such that the object and the support overlap the chosen transducer. With the micro-manipulator, the user might then position a visual marker 515 indicating the position of the center of the transducer, such as illustrated for instance in FIG. 9, with regard to the support and the object. The visual marker also preferably corresponds to the position of the dark sport of the swirling SAW, on top of which the object is to be entrapped.

Then, by powering the transducer, and generating a swirling SAW which is transmitted and propagates as an acoustic vortex or a pseudo acoustic vortex in the support up into the liquid medium, the object is manipulated, displaced and trapped on top of the dark spot.

Examples 1 to 4: Displacement, Fusion, Atomization and Division

A water droplet of initial volume 2 µl is disposed on the central zone of the electroacoustic device illustrated on FIG. 14. Burst of duration 25 µs, carrying a frequency of 11.9 MHz and variable repetition rates of a several kHz are used for droplet actuation. The corresponding pulse sequences are presented on the bottom of FIGS. 24 to 27.

Figure 27:
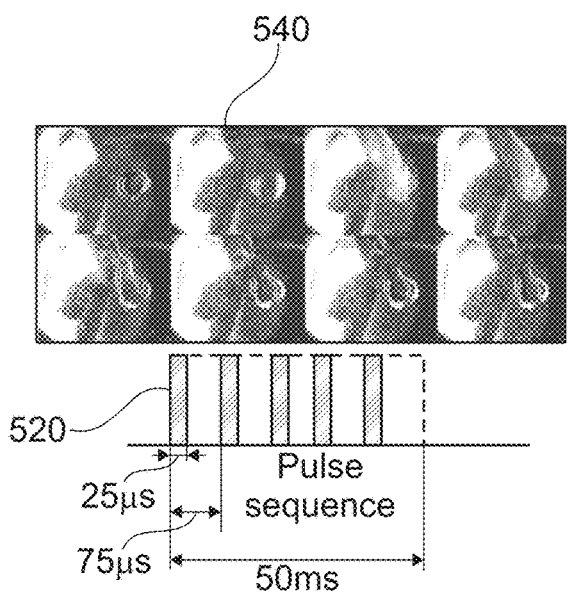

For every type of the pulse sequence 520 illustrated on FIGS. 24 to 27, the following manipulations have been performed: droplet displacement 525 (FIG. 24), fusion 530 of two droplets (FIG. 25), droplet atomization 535 (FIG. 26) which are obtained respectively with swirling SAWs of second and zero order. FIG. 27 shows droplet division 540 which is obtained by synthesizing burst of focalized waves with two different focal points.

Example 5: Cell Manipulation

Manipulating of cells and droplets are performed with the microscope as illustrated in FIG. 22, such as to create homogeneous or heterogeneous networks of cells such as stem cell niche, made of stem cells having similar physical properties.

Droplets are the basis of droplet-based microfluidics, used in the domain of single-cell biology. The electroacoustic device of the invention allows an in-depth study of rare events by sampling them within a large pool of experiments, currently a major issue of cancer and drug resistance research.

In this view, a central zone of a transducer is placed under a set of particles to be manipulated by displacement provided by the micro-manipulator. When a particle is at the center of the central zone of the transducer, the power supply is turned on to generate a swirling SAW in order to submit the particle to the attraction effect of the dark spot of the SAW. Operating is performed with a swirling SAW having a frequency of 30 MHz, and with voltage amplitude of 5 Vpp, which are enough such to entrap 10 µm sized particles.

Then the support is moved by translation provided by the micromanipulator while the trap, i.e. the position of the particle relative to the center of the transducer, remains fixed in space, whereas the other particles which are remote from the trap follow the support translation.

Once the selected object is moved, electrical power is turned off.

Then the procedure is repeated for displacing another particle such as to gather particles in a predefined pattern.

The trapping force is proportional to the acoustic power and is inversely proportional to the wavelength. It is also stronger for objects whose density and/or elasticity deviates from the fluid medium.

Example 6: Cell Deformation

The electroacoustic device is also implemented to apply forces on biological cells and particles.

It is nowadays understood that forces and stress on cells may determine their fate. Somatic cells adapt to stress and may rigidify, and stem cell differentiation may be affected by external mechanical stress. Nevertheless, methods were limited to apply stress on cells.

A liquid medium comprising antibody-coated microspheres and a cell membrane is placed beneath the object to be manipulated by displacement provided by the micromanipulator. A suitable transducer is electrically powered in order to entrap the antibody-coated microspheres on top of the center of the transducer. While electrical power is applied, the support is displaced such that the cell membrane comes into contact with the antibody-coated microspheres and is deformed by said microspheres.

Example 7: Steady Currents and Vorticity

Swirling SAWs are generated to create a steady swirling current in a microchannel, which is useful for contactless mixing, or for applying hydrodynamic stress to, or for moving particles of size of less than $\lambda/10$.

The streaming velocity is proportional to the acoustic power in a medium, and it increases with anyone of the square of the wave frequency, the swirl order, and the square of the height of the channel.

A chamber having a groove defining a microchannel is placed on the support, the groove being located plumb with the transducer center. A liquid medium having a set of particles is placed in the microchannel.

The groove has a depth preferably larger than $\lambda$, $\lambda$ being the wavelength of the swirling SAW. Powering the transducer results in streaming observed in the microchannel, in the form of a cyclone formed in the liquid medium, its eye being located at the center of the radiating swirling SAW. In order to promote streaming, the frequency might be increased, for instance using another transducer.

Example 8: Particle Displacement

Figure 28:
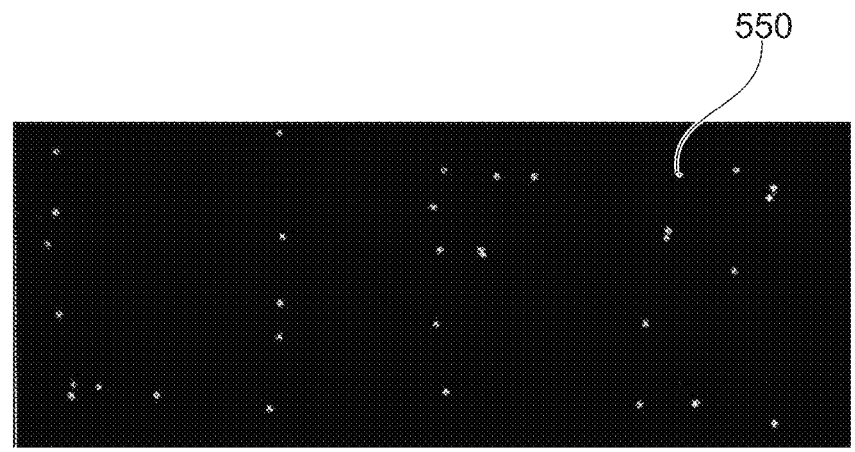

A droplet comprising a suspension of fluorescent polystyrene beads 550 of diameter 30 µm is deposited on the support of an electroacoustic device as illustrated on FIG. 20. A 3 mm thick cover made of PDMS is provided on top of the droplet, and defines an acoustic absorber as well as a slice glueing the droplet. A bead is chosen and is placed on top and close to the visual marker, and the transducer is powered. Then, the support is displaced by the manipulator, and the transducer is switched off, leaving the selected bead in a defined position. Repeating this operation on other beads of the suspension, a pattern of aligned beads defining the word "LIFE" is obtained, as illustrated in FIG. 28.

Needless to say, the invention is not limited to the embodiments supplied as examples.

The present invention is also notably intended for applications in the domain of microscopy, biology, microfluidics, for lab-on-chips, for manipulating nano- and micro-systems. In biophysics, it can be used for studying the behavior of single cells such as cancer cells or stem cells, and of cells networks, for instance implied in Alzheimer illness.

The invention claimed is:

1. A method for manipulating at least one object in a liquid medium, comprising:
    generating swirling surface acoustic waves with an electroacoustic device comprising a transducer, and
    propagating an acoustical vortex or a degenerated acoustical vortex induced by said surface acoustic waves into the liquid medium for creating therein a radiation pressure wherein said object is submitted, and manipulating the object through displacement of the transducer relative to the medium.

2. The method according to claim 1, wherein the electroacoustic device comprises a transducer comprising a piezoelectric substrate, first and second electrodes of inverse polarity comprising respective first and second tracks provided on said substrate, the first and second tracks spiraling around a same center, the transducer being configured for generating a swirling ultrasonic surface wave in the substrate.

3. The method according to claim 2, the electroacoustic device comprising a visual marking located in the central zone of the transducer, the method comprising arranging the electroacoustic device such that the visual marking is offset from the object, following by powering the transducer for generating a volume ultrasonic wave in the liquid medium such as to displace the object such that the object overlaps the visual marking.

4. The method according to claim 2, comprising observing the object with an optical device.

5. The method according to claim 1, comprising propagating the volume waves throughout the bulk of a solid support before said volume waves reach the liquid medium.

6. The method according to claim 1, the transducer being part of a device comprising on a single piezoelectric substrate track of at least two respective transducers having different patterns of electrodes.

7. The method according to claim 1, the device being rotatable about a rotation axis, and comprising rotating the device before or after using the transducer.

8. The method according to claim 1, comprising displacing the transducer relative to the medium using at least one electrical actuator.

9. The method according to claim 1, the transducer comprising an array of electrode tracks, the method comprising powering the electrode tracks with a single AC source.

10. The method according to claim 1, comprising inducing a hydrodynamic vortex in the fluid in the vicinity of the object with an acoustical vortex or a degenerated acoustical vortex for changing the orientation of the object.

11. The method according to claim 1, comprising generating acoustical vortices in the fluid in the vicinity of the object in order to generate torques for inducing rotation thereof.

12. The method according to claim 1, comprising converging the acoustical vortex or the degenerated acoustical into the liquid medium in a zone plumb with the center of a central zone of the transducer, so as to entrap the object along the direction around which the acoustical vortex or the degenerated acoustical vortex swirls.

13. The method according to claim 1, comprising inducing a hydrodynamic vortex in the liquid medium.

14. The method according to claim 1, the object being a biological material.

15. The method according to claim 1, comprising pre-distorting a wavefront of said ultrasonic surface waves so as to control degeneration of the bulk acoustical vortex.

\* \* \* \* \*